US012690326B2

(12) United States Patent
Park et al.

(10) Patent No.: US 12,690,326 B2
(45) Date of Patent: Jul. 21, 2026

(54) DISPLAY DEVICE AND ELECTRONIC DEVICE INCLUDING THE SAME

(71) Applicant: Samsung Display Co., Ltd., Yongin-si (KR)

(72) Inventors: Jaechun Park, Seoul (KR); Minseop Kim, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 702 days.

(21) Appl. No.: 17/877,035

(22) Filed: Jul. 29, 2022

(65) Prior Publication Data

US 2023/0136429 A1     May 4, 2023

(30) Foreign Application Priority Data

Nov. 4, 2021     (KR) ........................ 10-2021-0150953

(51) Int. Cl.
H10K 50/87        (2023.01)
H10K 50/86        (2023.01)
H10K 102/00       (2023.01)

(52) U.S. Cl.
CPC ........... H10K 50/87 (2023.02); H10K 50/865 (2023.02); H10K 2102/311 (2023.02)

(58) Field of Classification Search
CPC .... H10K 50/87; H10K 50/865; H10K 50/841; H10K 50/8426; H10K 2102/311; H10K 59/126; H10K 59/131; H10K 59/8794; H10K 59/12; H10K 59/00; H10K 59/1275; H10K 59/65; H10K 77/111; H10K 71/00; H10K 71/50; Y02E 10/549; G06F 1/1656; G06F 1/1652; G09F 9/301; G09F 9/335;
(Continued)

(56) References Cited

U.S. PATENT DOCUMENTS 9,964,995 B1     5/2018   Morrison et al.
11,226,509 B2    1/2022   Ito et al.
(Continued)

FOREIGN PATENT DOCUMENTS

CN     106409865 A  *  2/2017  ............. H01L 21/77
CN     206618929 U     11/2017
(Continued)

OTHER PUBLICATIONS

Liu_English1, liu translation (Year: 2021).*
(Continued)

*Primary Examiner* — Minsun O Harvey
*Assistant Examiner* — Alexander Ehrlich
(74) *Attorney, Agent, or Firm* — CANTOR COLBURN LLP

(57)     ABSTRACT

A display device includes: a display panel including a first area, a second area including an alignment mark, and a bending area disposed between the first and second areas and bent such that the second area is disposed under the first area; a heat radiating layer disposed between the first area and the second area; a spacer disposed between the heat radiating layer and the second area; and a light-blocking tape disposed between the heat radiating layer and the spacer and extending outside an edge of the spacer when viewed on a plane. The alignment mark overlaps the light-blocking tape when viewed on the plane.

20 Claims, 25 Drawing Sheets

(58) Field of Classification Search

CPC .......... H05K 7/20954; G02F 1/133305; G02F 1/133308; G02F 2201/503

See application file for complete search history.

(56) References Cited

U.S. PATENT DOCUMENTS

| | | | |
|---|---|---|---|
| 2011/0157512 A1 | 6/2011 | Mishima | |
| 2012/0076454 A1 | 3/2012 | Shiraishi | |
| 2014/0124744 A1* | 5/2014 | Oh | H10K 59/353 |
| | | | 438/35 |
| 2014/0145167 A1 | 5/2014 | Son | |
| 2014/0370228 A1 | 12/2014 | Wei et al. | |
| 2017/0150622 A1 | 5/2017 | Kim et al. | |
| 2018/0019417 A1 | 1/2018 | Andou | |
| 2018/0027673 A1* | 1/2018 | Andou | H05K 1/028 |
| | | | 361/749 |
| 2018/0212190 A1 | 7/2018 | Son et al. | |
| 2018/0300005 A1 | 10/2018 | Yeo et al. | |
| 2018/0331322 A1* | 11/2018 | Son | H10K 59/131 |
| 2019/0146267 A1* | 5/2019 | Tanaka | G02F 1/133308 |
| | | | 349/33 |
| 2019/0179470 A1* | 6/2019 | Hong | G09G 3/3233 |
| 2020/0022261 A1 | 1/2020 | Choi | |
| 2020/0168675 A1 | 5/2020 | Kim et al. | |
| 2020/0183455 A1* | 6/2020 | Park | G06F 1/1626 |
| 2020/0192433 A1 | 6/2020 | Shin et al. | |
| 2020/0219956 A1 | 7/2020 | Aoki et al. | |
| 2020/0348722 A1 | 11/2020 | Lee | |
| 2021/0050534 A1 | 2/2021 | Yang et al. | |
| 2021/0051822 A1* | 2/2021 | Gao | H10K 59/8794 |
| 2021/0191185 A1* | 6/2021 | Dai | G02F 1/133385 |
| 2021/0288282 A1 | 9/2021 | Kim et al. | |
| 2021/0327312 A1 | 10/2021 | Choi et al. | |

FOREIGN PATENT DOCUMENTS

| | | | | |
|---|---|---|---|---|
| CN | 112420792 A | * | 2/2021 | G09F 9/301 |
| CN | 113115569 A | | 7/2021 | |
| CN | 113257123 A | | 8/2021 | |
| CN | 113437048 A | * | 9/2021 | H01L 23/544 |
| EP | 2772826 A2 | | 9/2014 | |
| GB | 2549636 A | | 10/2017 | |
| JP | 2004047458 A | * | 2/2004 | H01L 51/5243 |
| JP | 2011187831 A | | 9/2011 | |
| JP | 2021026068 A | | 2/2021 | |
| KR | 1020130044405 A | | 5/2013 | |
| KR | 1020140108826 A | | 9/2014 | |
| KR | 1020140108827 A | | 9/2014 | |
| WO | 9950700 A1 | | 10/1999 | |
| WO | 2019107889 A1 | | 6/2019 | |

OTHER PUBLICATIONS

Duan_English, duan translation (Year: 2021).*

Yoneda_English, yoneda translation (Year: 2004).*

Chen_English, chen translation (Year: 2017).*

Extended European Search Report for Application No. 22202995.1-1224 dated Jul. 4, 2023.

* cited by examiner

RHL1
BTAP
SPC
PLT
PLT1

CRP  AA2

IV        IV'

BA    AM

DR3 → DR1
↓
DR2

AM  AA2

BTAP

DP
ADH1
SPC
ADH2
RHL1
ADH3
PLT1

IV                IV'

PLT

DR2 → DR1
↓
DR3

1

DISPLAY DEVICE AND ELECTRONIC DEVICE INCLUDING THE SAME

This application claims to Korean Patent Application No. 10-2021-0150953, filed on Nov. 4, 2021, and all the benefits accruing therefrom under 35 U.S.C. § 119, the content of which in its entirety is herein incorporated by reference.

BACKGROUND

Embodiments of the present disclosure described herein relate to a display device and an electronic device including the same.

In general, an electronic device, such as a smart phone, a digital camera, a notebook computer, a navigation system, a smart television, and the like, which provide an image to a user includes a display device for displaying an image. The display device generates an image and provides the image to the user through a display screen.

With the development of display device technologies, various forms of display devices have been developed. For example, various flexible display devices that can be curved, folded, or rolled have been developed. The flexible display devices may be easy to carry and may improve user convenience.

Among the flexible display devices, a foldable display device is folded about a folding axis. The foldable display device includes a display module that is folded about the folding axis and a support part that is disposed under the display module and that supports the display module. The support part is folded about the folding axis together with the display module.

SUMMARY

Embodiments of the present disclosure provide a display device for improving a recognition rate of an alignment mark and preventing visibility of a printed circuit board in a bending process of a display panel, and an electronic device including the display device.

According to an embodiment, a display device includes: a display panel including a first area, a second area including an alignment mark, and a bending area disposed between the first and second areas and bent such that the second area is disposed under the first area; a heat radiating layer disposed between the first area and the second area; a spacer disposed between the heat radiating layer and the second area; and a light-blocking tape that is disposed between the heat radiating layer and the spacer and that extends outside an edge of the spacer when viewed on a plane. The alignment mark overlaps the light-blocking tape when viewed on the plane.

According to an embodiment, a display device includes: a display panel including a first area, a second area including an alignment mark, and a bending area disposed between the first and second areas and bent such that the second area is disposed under the first area; a heat radiating layer disposed between the first area and the second area; a spacer disposed between the heat radiating layer and the second area; a light-blocking tape that is disposed between the heat radiating layer and the spacer and that extends outside an edge of the spacer and overlaps the alignment mark when viewed on a plane; a printed circuit board connected to one side of the second area; a first tape attached to the printed circuit board and the heat radiating layer and adjacent to an edge of the printed circuit board; and a second tape attached to the printed circuit board and not attached to the heat radiating layer, the second tape being located farther away from the edge of the printed circuit board than the first tape.

According to an embodiment, an electronic device includes: a display device having a first transmissive area defined therein through which an optical signal passes; an electro-optical module that is disposed under the display device and which overlaps the first transmissive area and receives the optical signal when viewed on a plane, and a case which accommodates the display device and the electro-optical module. The display device includes: a display panel including a first area, a second area including an alignment mark, and a bending area disposed between the first and second areas and bent such that the second area is disposed under the first area, a heat radiating layer disposed between the first area and the second area, a spacer disposed between the heat radiating layer and the second area, and a light-blocking tape that is disposed between the heat radiating layer and the spacer and that extends outside an edge of the spacer when viewed on the plane. The alignment mark overlaps the light-blocking tape when viewed on the plane.

BRIEF DESCRIPTION OF THE FIGURES

The above and other aspects and features of the present disclosure will become apparent by describing in detail embodiments thereof with reference to the accompanying drawings.

DETAILED DESCRIPTION

Figure 1:
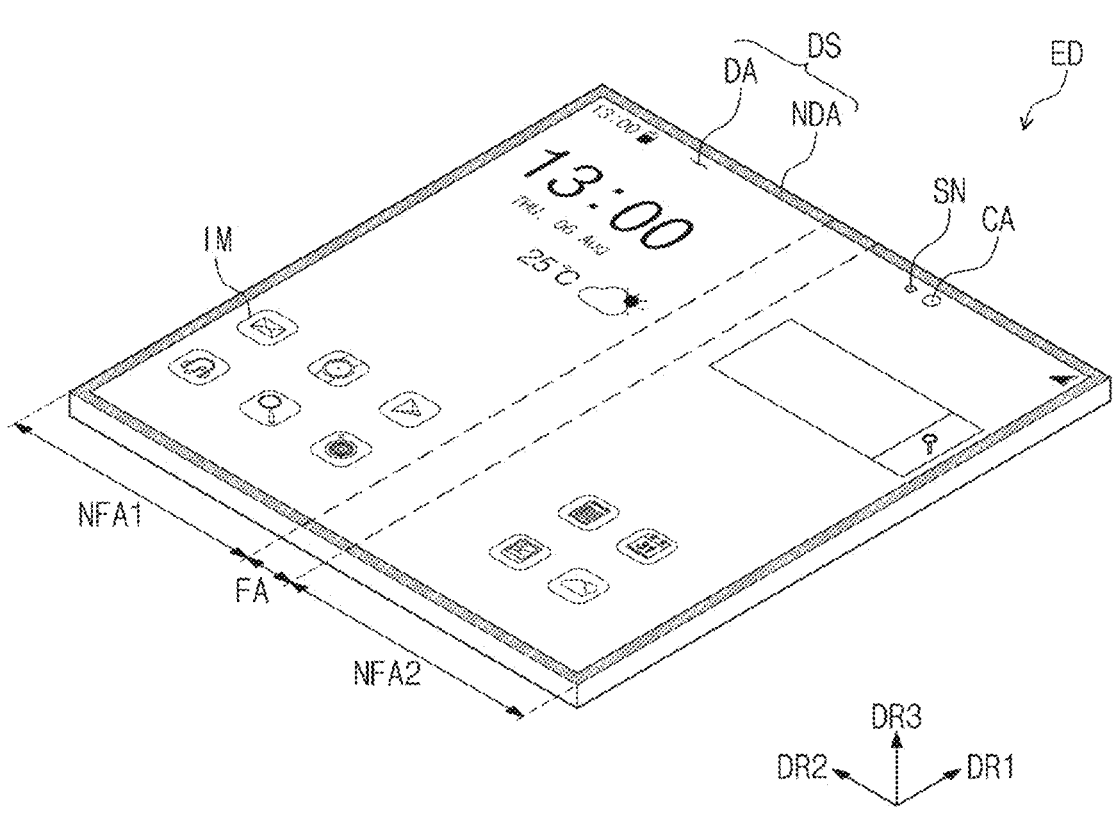
FIG. 1 is a perspective view of an electronic device according to an embodiment of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Hereinafter, embodiments of the present disclosure will be described with reference to the accompanying drawings.

Figure 2:
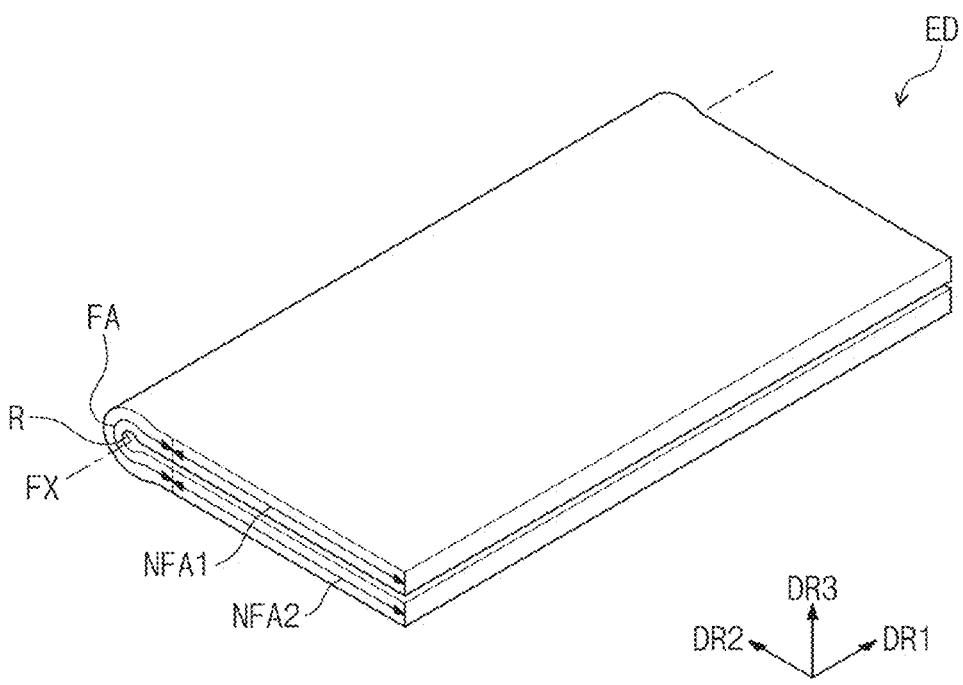
FIG. 2 is a view illustrating a folded state of the electronic device illustrated in FIG. 1.

FIG. 1 is a perspective view of an electronic device according to an embodiment of the present disclosure. FIG. 2 is a view illustrating a folded state of the electronic device illustrated in FIG. 1.

Referring to FIG. 1, the electronic device ED according to an embodiment of the present disclosure may have a rectangular shape with long sides extending in a first direction DR1 and short sides extending in a second direction DR2 crossing the first direction DR1. However, without being limited thereto, the electronic device ED may have various shapes such as a circular shape, a polygonal shape, and the like. The electronic device ED may be a flexible display device.

Hereinafter, a direction substantially perpendicular to a plane defined by the first direction DR1 and the second direction DR2 is defined as a third direction DR3. Furthermore, the expression "when viewed on the plane" or "in a plan view" used herein may mean that it is viewed in the third direction DR3.

The electronic device ED may include a folding area FA and a plurality of non-folding areas NFA1 and NFA2. The non-folding areas NFA1 and NFA2 may include the first non-folding area NFA1 and the second non-folding area NFA2. The folding area FA may be disposed between the first non-folding area NFA1 and the second non-folding area NFA2. The folding area FA, the first non-folding area NFA1, and the second non-folding area NFA2 may be arranged in the second direction DR2.

Although one folding area FA and two non-folding areas NFA1 and NFA2 are illustrated, the number of folding areas FA and the number of non-folding areas NFA1 and NFA2 are not limited thereto. For example, the electronic device ED may include more than two non-folding areas and a plurality of folding areas disposed between the non-folding areas in another embodiment.

An upper surface of the electronic device ED may be defined as a display surface DS, and the display surface DS may have a plane defined by the first direction DR1 and the second direction DR2. Images IM generated by the electronic device ED may be provided to a user through the display surface DS.

The display surface DS may include a display area DA and a non-display area NDA around the display area DA. The display area DA may display an image, and the non-display area NDA may not display an image. The non-display area NDA may surround the display area DA and may define a border of the electronic device ED that is printed in a predetermined color.

The electronic device ED may include at least one sensor SN and at least one camera CA. The sensor SN and the camera CA may be adjacent to the border of the electronic device ED. The sensor SN and the camera CA may be disposed in the display area DA adjacent to the non-display area NDA. The sensor SN and the camera CA may be disposed in the second non-folding area NFA2. However, without being limited thereto, the sensor SN and the camera CA may be disposed in the first non-folding area NFA1.

Light may transmit through the portions of the electronic device ED where the sensor SN and the camera CA are disposed and may be provided to the camera CA and the sensor SN. For example, the sensor SN may be a proximity illuminance sensor. However, the type of the sensor SN is not limited thereto. The camera CA may take an external image. A plurality of sensors SN and a plurality of cameras CA may be provided in another embodiment.

Referring to FIG. 2, the electronic device ED may be a foldable electronic device ED that is folded or unfolded. For example, the folding area FA may be bent about a folding axis FX parallel to the first direction DR1, and the electronic device ED may be folded accordingly. The folding axis FX may be defined as a long axis parallel to the long sides of the electronic device ED.

When the electronic device ED is folded, the first non-folding area NFA1 and the second non-folding area NFA2 may face each other, and the electronic device ED may be folded in an in-folding manner such that the display surface DS is not exposed to the outside. However, embodiments of the present disclosure are not limited thereto. For example, the electronic device ED may be folded about the folding axis FX in an out-folding manner such that the display surface DS is exposed to the outside in another embodiment.

The distance between the first non-folding area NFA1 and the second non-folding area NFA2 may be smaller than the diameter of a circle defined by a radius R of curvature. Accordingly, the folding area FA may be folded in a dumbbell shape when viewed in the first direction DR1.

Figure 3:
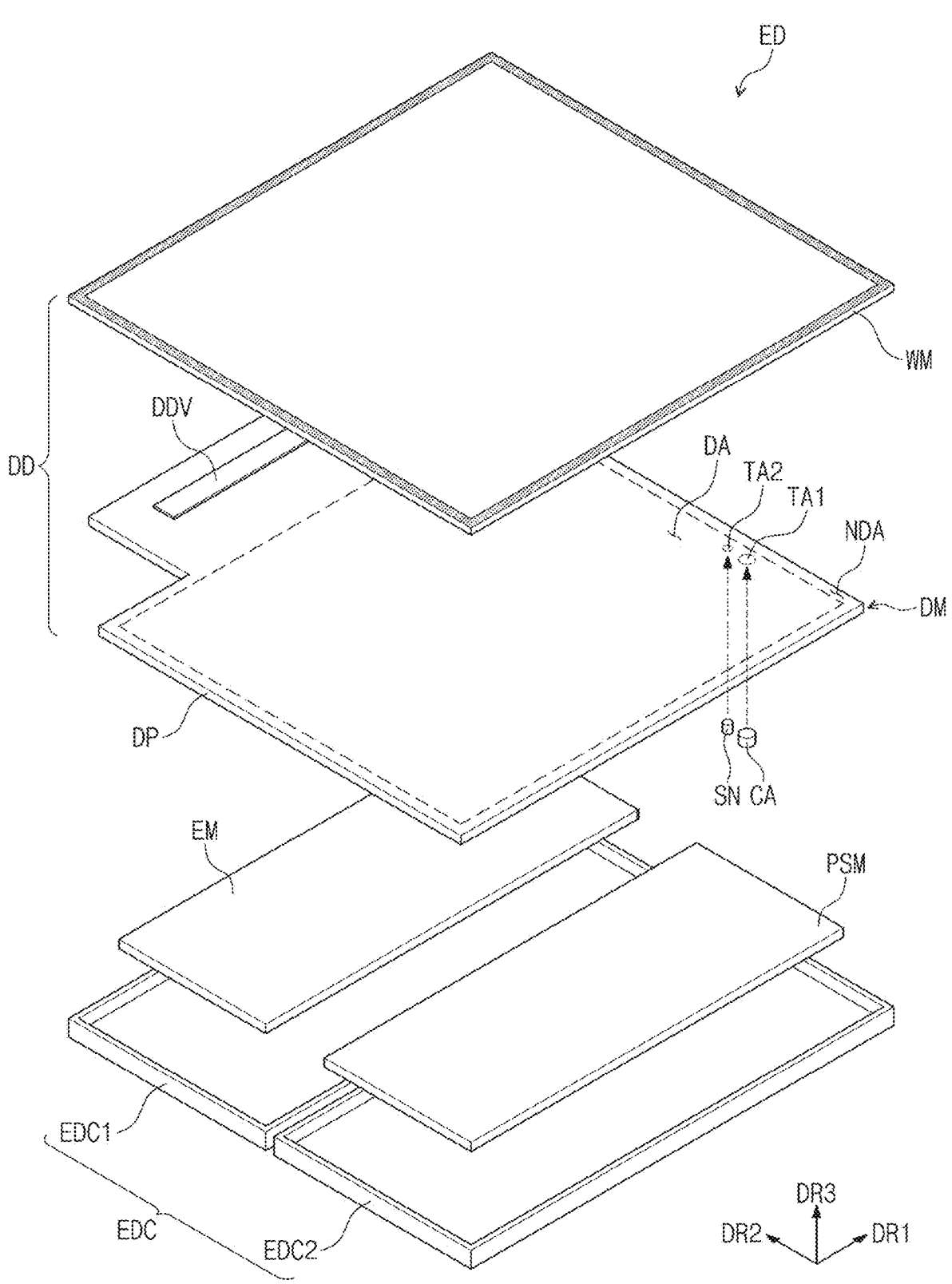
FIG. 3 is an exploded perspective view of the electronic device illustrated in FIG. 1.

FIG. 3 is an exploded perspective view of the electronic device illustrated in FIG. 1.

Referring to FIG. 3, the electronic device ED may include a display device DD, the camera CA, the sensor SN, an electronic module EM, a power supply module PSM, and a case EDC. Although not separately illustrated, the electronic device ED may further include a mechanical structure (e.g., a hinge) for controlling a folding motion of the display device DD.

The display device DD may generate an image and may sense an external input. The display device DD may include a window module WM and a display module DM. The window module WM may provide the front surface of the electronic device ED. The window module WM may be disposed on the display module DM and may protect the display module DM. The window module WM may pass light generated from the display module DM and may provide the light to the user.

The display module DM may include a display panel DP. Although only the display panel DP among stacked structures of the display module DM is illustrated in FIG. 3, the display module DM may substantially further include a plurality of components disposed over and under the display panel DP. A detailed stacked structure of the display module DM will be described below in detail. The display panel DP may include a display area DA and a non-display area NDA that correspond to the display area DA (refer to FIG. 1) and the non-display area NDA (refer to FIG. 1) of the electronic device ED.

A first transmissive area TA1 and a second transmissive area TA2 may be defined in the display panel DP. The first transmissive area TA1 and the second transmissive area TA2 may have a higher light transmittance than the surrounding area. The camera CA may be disposed under the first transmissive area TA1, and the sensor SN may be disposed under the second transmissive area TA2. Light passing through the first and second transmissive areas TA1 and TA2 may be provided to the camera CA and the sensor SN.

The display module DM may include a data driver DDV disposed on the non-display area NDA of the display panel DP. The data driver DDV may be manufactured in the form of an integrated circuit chip and may be mounted on the non-display area NDA. However, without being limited thereto, the data driver DDV may be mounted on a printed circuit board connected to the display panel DP.

The electronic module EM and the power supply module PSM may be disposed under the display device DD. Although not illustrated, the electronic module EM and the power supply module PSM may be connected with each other through a separate printed circuit board. The electronic module EM may control operation of the display device DD. The power supply module PSM may supply power to the electronic module EM.

The case EDC may accommodate the display device DD, the electronic module EM, and the power supply module PSM. To fold the display device DD, the case EDC may include a first case EDC1 and a second case EDC2. The first case EDC1 and the second case EDC2 may extend in the first direction DR1 and may be arranged in the second direction DR2.

Although not illustrated, the electronic device ED may further include a hinge structure for connecting the first case EDC1 and the second case EDC2. The case EDC may be coupled with the window module WM. The case EDC may protect the display device DD, the electronic module EM, and the power supply module PSM.

Figure 4:
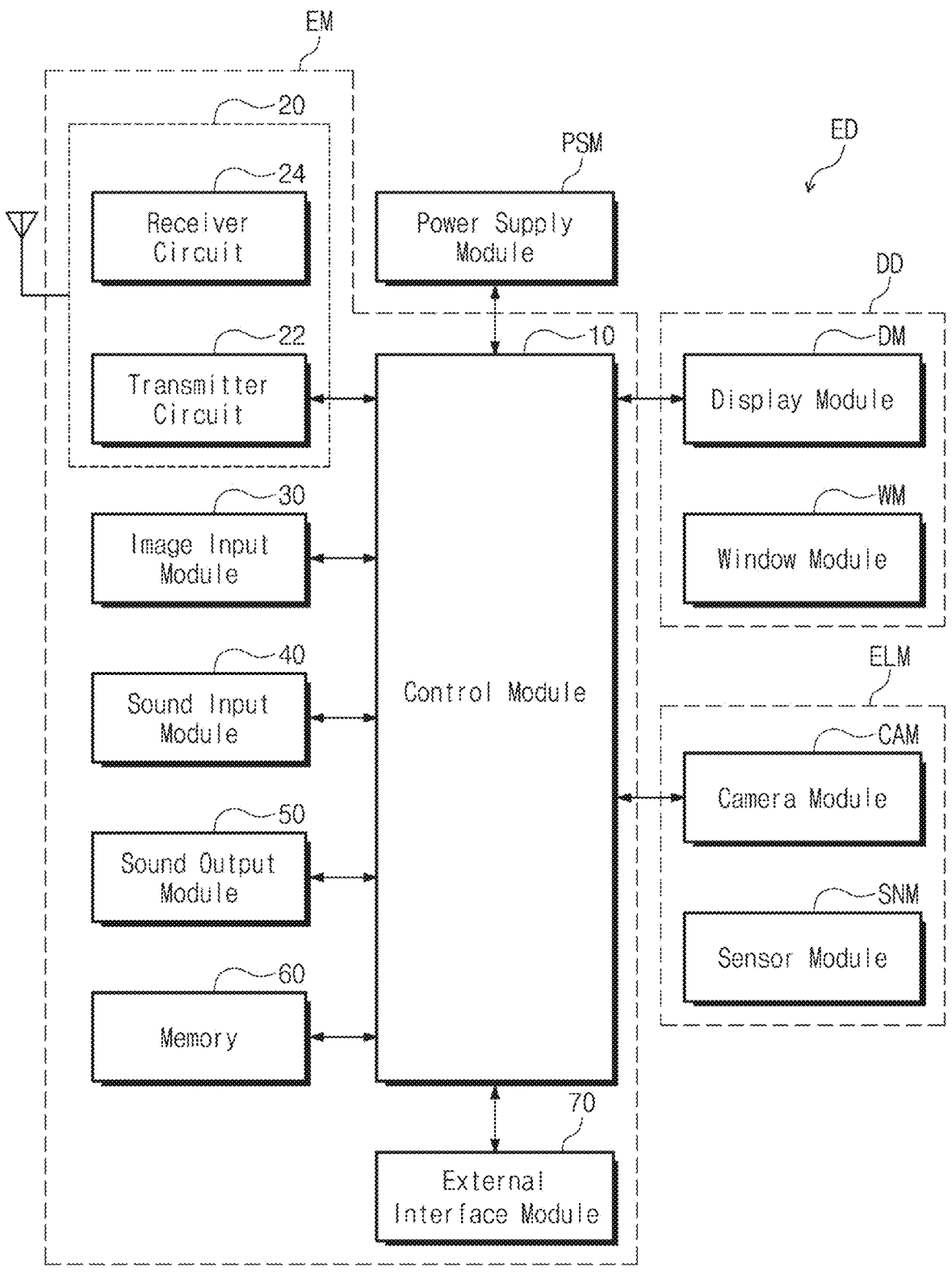
FIG. 4 is a block diagram of the electronic device illustrated in FIG. 3.

FIG. 4 is a block diagram of the electronic device illustrated in FIG. 3.

Referring to FIG. 4, the electronic device ED may include the electronic module EM, the power supply module PSM, the display device DD, and an electro-optical module ELM. The electronic module EM may include a control module 10, a wireless communication module 20, an image input module 30, a sound input module 40, a sound output module 50, a memory 60, and an external interface module 70. The modules may be mounted on a circuit board, or may be electrically connected through a flexible circuit board. The electronic module EM may be electrically connected with the power supply module PSM.

The control module 10 may control overall operation of the electronic device ED. For example, the control module 10 may activate or deactivate the display device DD in response to a user input. The control module 10 may control the image input module 30, the sound input module 40, and the sound output module 50 in response to a user input. The control module 10 may include at least one microprocessor.

The wireless communication module 20 may transmit/receive wireless signals with another terminal through Bluetooth or Wi-Fi. The wireless communication module 20 may transmit/receive sound signals using a general communication line. The wireless communication module 20 may include a transmitter circuit 22 that modulates a signal to be transmitted and transmits the modulated signal and a receiver circuit 24 that demodulates a received signal.

The image input module 30 may process an image signal to covert the image signal into image data that can be displayed on the display device DD. The sound input module 40 may receive an external sound signal through a microphone in a voice recording mode or a voice recognition mode and may convert the external sound signal into electrical voice data. The sound output module 50 may convert sound data received from the wireless communication module 20 or sound data stored in the memory 60 and may output the converted data to the outside.

The external interface module 70 may serve as an interface connected to an external charger, a wired/wireless data port, a card socket (e.g., a memory card or a SIM/UIM card), or the like.

The power supply module PSM may supply power for overall operation of the electronic device ED. The power supply module PSM may include a conventional battery device.

The electro-optical module ELM may be an electronic part that outputs or receives an optical signal. The electro-optical module ELM may transmit or receive an optical signal through a partial area of the display device DD. In this embodiment, the electro-optical module ELM may include a camera module CAM and a sensor module SNM. The camera module CAM may include the camera CA illustrated in FIG. 3. The sensor module SNM may include the sensor SN illustrated in FIG. 3.

Figure 5:
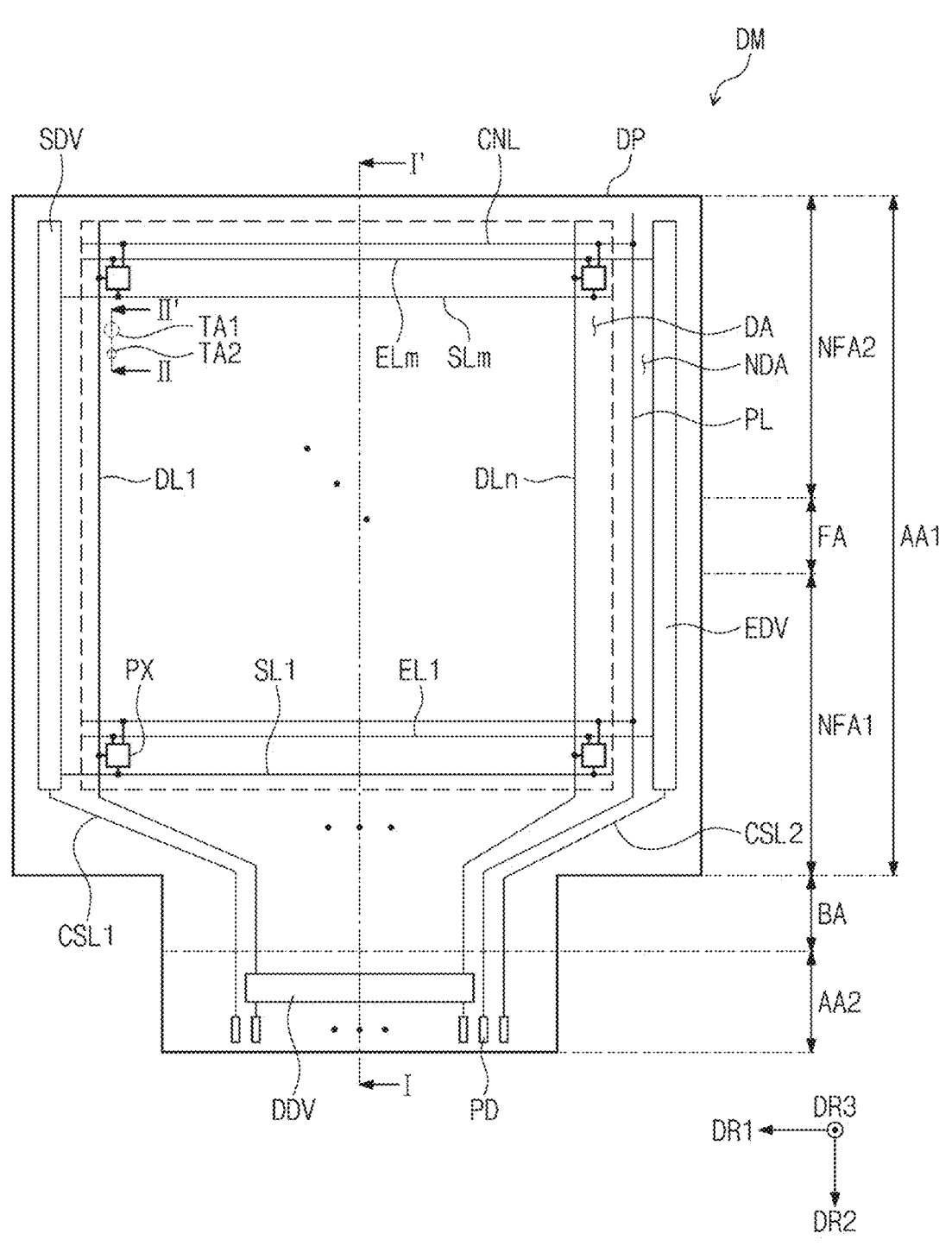
FIG. 5 is a plan view of a display panel illustrated in FIG. 3.

FIG. 5 is a plan view of the display panel illustrated in FIG. 3.

Referring to FIG. 5, the display module DM may include the display panel DP, a scan driver SDV, the data driver DDV, and an emission driver EDV.

The display panel DP may include a first area AA1, a second area AA2, and a bending area BA between the first area AA1 and the second area AA2. The bending area BA may extend in the first direction DR1, and the first area AA1, the bending area BA, and the second area AA2 may be arranged in the second direction DR2.

The first area AA1 may include a display area DA and a non-display area NDA around the display area DA. The non-display area NDA may surround the display area DA. The display area DA may be an area that displays an image, and the non-display area NDA may be an area that does not display an image. The second area AA2 and the bending area BA may be areas that do not display an image.

The first area AA1, when viewed in the first direction DR1, may include a first non-folding area NFA1, a second non-folding area NFA2, and a folding area FA between the first non-folding area NFA1 and the second non-folding area NFA2. As the folding area FA is folded about the above-described folding axis FX, the display panel DP may be folded. The first and second transmissive areas TA1 and TA2 may be defined in the display area DA and the second non-folding area NFA2.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a power line PL, a plurality of connecting lines CNL, and a plurality of pads PD. "m" and "n" are natural numbers. The pixels PX may be disposed in the display area DA and may be connected to the scan lines SL1 to SLm, the data lines DL1 to DLn, and the emission lines EL1 to ELm.

The scan driver SDV and the emission driver EDV may be disposed in the non-display area NDA. The scan driver SDV and the emission driver EDV may be disposed in the non-display areas NDA adjacent to opposite sides of the first area AA1 that are opposite each other in the first direction DR1. The data driver DDV may be disposed in the second area AA2. The data driver DDV may be manufactured in the form of an integrated circuit chip and may be mounted on the second area AA2.

The scan lines SL1 to SLm may extend in the first direction DR1 and may be connected to the scan driver SDV. The data lines DL1 to DLn may extend in the second direction DR2 and may be connected to the data driver DDV via the bending area BA. The emission lines EL1 to ELm may extend in the first direction DR1 and may be connected to the emission driver EDV.

The power line PL may extend in the second direction DR2 and may be disposed in the non-display area NDA. The power line PL may be disposed between the display area DA and the emission driver EDV. However, without being limited thereto, the power line PL may be disposed between the display area DA and the scan driver SDV.

The power line PL may extend to the second area AA2 via the bending area BA. The power line PL may extend toward a lower end of the second area AA2 when viewed on the plane. The power line PL may receive a drive voltage.

The connecting lines CNL may extend in the first direction DR1 and may be arranged in the second direction DR2. The connecting lines CNL may be connected to the power line PL and the pixels PX. The drive voltage may be applied to the pixels PX through the power line PL and the connecting lines CNL connected with each other.

The first control line CSL1 may be connected to the scan driver SDV and may extend toward the lower end of the second area AA2 via the bending area BA. The second control line CSL2 may be connected to the emission driver EDV and may extend toward the lower end of the second area AA2 via the bending area BA. The data driver DDV may be disposed between the first control line CSL1 and the second control line CSL2.

The pads PD may be disposed adjacent to the lower end of the second area AA2 when viewed on the plane. The data driver DDV, the power line PL, the first control line CSL1, and the second control line CSL2 may be connected to the pads PD.

The data lines DL1 to DLn may be connected to the corresponding pads PD through the data driver DDV. For example, the data lines DL1 to DLn may be connected to the data driver DDV, and the data driver DDV may be connected to the pads PD corresponding to the data lines DL1 to DLn.

A printed circuit board may be connected to the pads PD, and a timing controller and a voltage generator may be disposed on the printed circuit board. The timing controller may be manufactured in the form of an integrated circuit chip and may be mounted on the printed circuit board. The timing controller and the voltage generator may be connected to the pads PD through the printed circuit board.

The timing controller may control operations of the scan driver SDV, the data driver DDV, and the emission driver EDV. The timing controller may generate a scan control signal, a data control signal, and an emission control signal in response to control signals received from the outside. The voltage generator may generate the drive voltage.

The scan control signal may be provided to the scan driver SDV through the first control line CSL1. The emission control signal may be provided to the emission driver EDV through the second control line CSL2. The data control signal may be provided to the data driver DDV. The timing controller may receive image signals from the outside, may convert the data format of the image signals according to the specification of an interface with the data driver DDV, and may provide the converted signals to the data driver DDV.

The scan driver SDV may generate a plurality of scan signals in response to the scan control signal. The scan signals may be applied to the pixels PX through the scan lines SL1 to SLm. The scan signals may be sequentially applied to the pixels PX.

The data driver DDV may generate a plurality of data voltages corresponding to the image signals in response to the data control signal. The data voltages may be applied to the pixels PX through the data lines DL1 to DLn. The emission driver EDV may generate a plurality of emission signals in response to the emission control signal. The emission signals may be applied to the pixels PX through the emission lines EL1 to ELm.

The pixels PX may receive the data voltages in response to the scan signals. The pixels PX may display an image by emitting light having luminance corresponding to the data voltages in response to the emission signals. Emission time of the pixels PX may be controlled by the emission signals.

Figure 6:
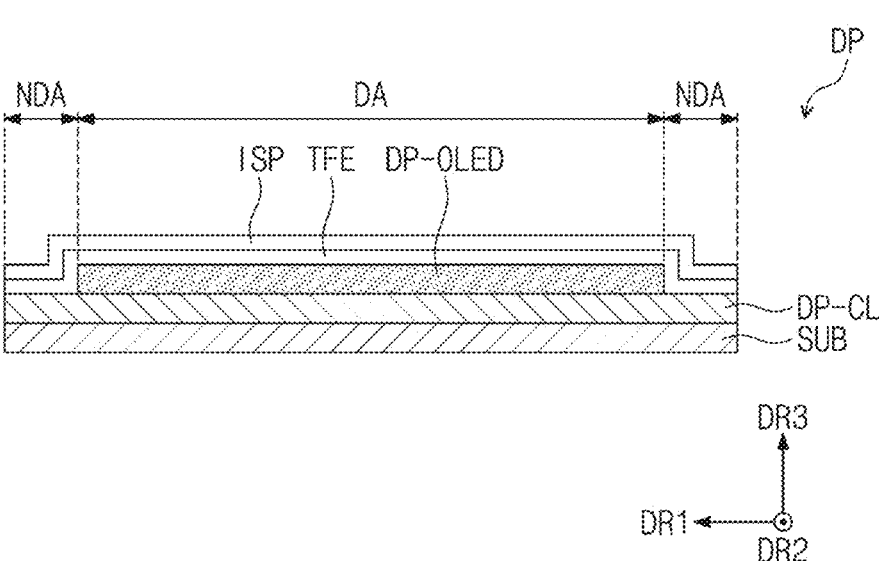
FIG. 6 is a sectional view of the display panel illustrated in FIG. 3.

FIG. 6 is a sectional view of the display panel illustrated in FIG. 3.

In FIG. 6, a section of the display panel DP viewed in the second direction DR2 is illustrated.

Referring to FIG. 6, the display panel DP may include a substrate SUB, a circuit element layer DP-CL disposed on the substrate SUB, a display element layer DP-OLED disposed on the circuit element layer DP-CL, a thin film encapsulation layer TFE disposed on the display element layer DP-OLED, and an input sensing part ISP disposed on the thin film encapsulation layer TEF.

The substrate SUB may include a display area DA and a non-display area NDA around the display area DA. The substrate SUB may contain a flexible plastic material. For example, the substrate SUB may contain polyimide ("PI"). The display element layer DP-OLED may be disposed over the display area DA.

The circuit element layer DP-CL may include transistors. The display element layer DP-OLED may include light emitting elements connected to the transistors. The pixels PX illustrated in FIG. 5 may include transistors and light emitting elements.

The thin film encapsulation layer TFE may be disposed on the circuit element layer DP-CL to cover the display element layer DP-OLED. The thin film encapsulation layer TFE may protect the pixels PX from moisture/oxygen and foreign matter such as dust particles.

The input sensing part ISP may include a plurality of sensors (not illustrated) for sensing an external input. The sensors may sense the external input in a capacitive manner. The external input may include various forms of inputs, such as a part of the user's body, light, heat, a pen, pressure, and the like.

The input sensing part ISP may be directly manufactured on the thin film encapsulation layer TFE in manufacture of the display panel DP. However, without being limited thereto, the input sensing part ISP may be manufactured as a panel separate from the display panel DP and may be attached to the display panel DP by an adhesive layer.

Figure 7:
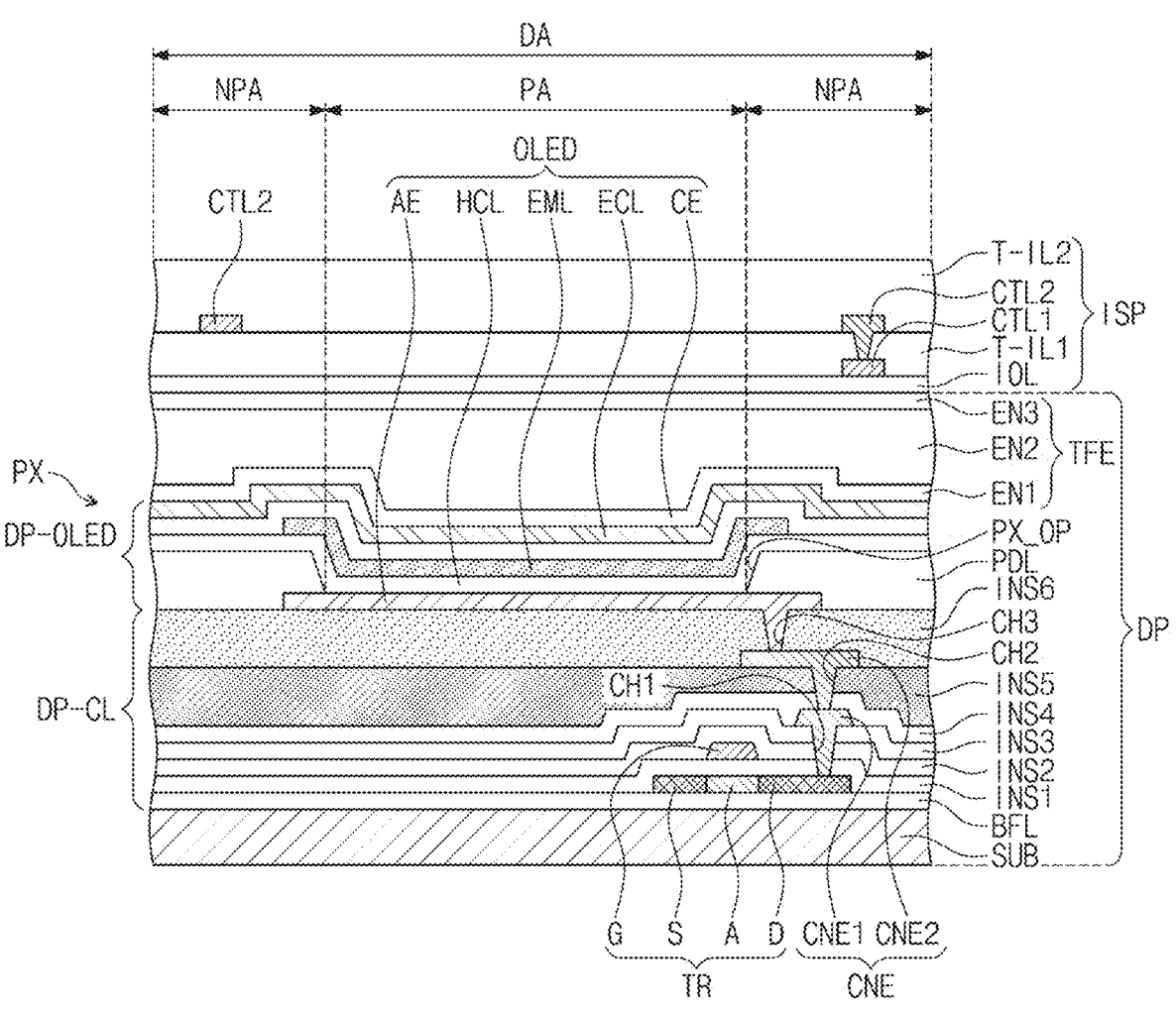
FIG. 7 is a view illustrating a section of the display panel corresponding to any one pixel illustrated in FIG. 5.

FIG. 7 is a view illustrating a section of the display panel corresponding to any one pixel illustrated in FIG. 5.

Referring to FIG. 7, the pixel PX may include a transistor TR and a light emitting element OLED. The light emitting element OLED may include a first electrode AE (or, an anode), a second electrode CE (or, a cathode), a hole control layer HCL, an electron control layer ECL, and an emissive layer EML.

The transistor TR and the light emitting element OLED may be disposed over the substrate SUB. Although one transistor TR is illustrated, the pixel PX may substantially include a plurality of transistors and at least one capacitor for driving the light emitting element OLED.

The display area DA may include an emissive area PA corresponding to each of the pixels PX and a non-emissive area NPA around the emissive area PA. The light emitting element OLED may be disposed in the emissive area PA.

A buffer layer BFL may be disposed on the substrate SUB. The buffer layer BFL may be an inorganic layer. A semiconductor pattern may be disposed on the buffer layer BFL. The semiconductor pattern may contain poly silicon, amorphous silicon, or metal oxide.

The semiconductor pattern may be doped with an N-type dopant or a P-type dopant. The semiconductor pattern may include a heavily doped area and a lightly doped area. The heavily doped area may have a higher conductivity than the lightly doped area and may substantially serve as a source electrode and a drain electrode of the transistor TR. The lightly doped area may substantially correspond to an active (or, channel) area of the transistor TR.

A source S, an active area A, and a drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connecting electrode CNE may include a first connecting electrode CNE1 and a second connecting electrode CNE2 for connecting the transistor TR and the light emitting element OLED. The first connecting electrode CNE1 may be disposed on the third insulating layer INS3 and may be connected to the drain D through a first contact hole CH1 defined in the first to third insulating layers INS1 to INS3.

A fourth insulating layer INS4 may be disposed on the first connecting electrode CNE1. A fifth insulating layer INS5 may be disposed on the fourth insulating layer INS4. The second connecting electrode CNE2 may be disposed on the fifth insulating layer INS5. The second connecting electrode CNE2 may be connected to the first connecting electrode CNE1 through a second contact hole CH2 defined in the fourth and fifth insulating layers INS4 and INS5.

A sixth insulating layer INS6 may be disposed on the second connecting electrode CNE2. The layers from the buffer layer BFL to the sixth insulating layer INS6 may be defined as the circuit element layer DP-CL. The first to sixth insulating layers INS1 to INS6 may be inorganic layers or organic layers.

The first electrode AE may be disposed on the sixth insulating layer INS6. The first electrode AE may be connected to the second connecting electrode CNE2 through a third contact hole CH3 defined in the sixth insulating layer INS6. A pixel defining film PDL having an opening PX_OP defined therein for exposing a predetermined portion of the first electrode AE may be disposed on the first electrode AE and the sixth insulating layer INS6.

The hole control layer HCL may be disposed on the first electrode AE and the pixel defining film PDL. The hole control layer HCL may include a hole transporting layer and a hole injection layer.

The emissive layer EML may be disposed on the hole control layer HCL. The emissive layer EML may be disposed in an area corresponding to the opening PX_OP. The emissive layer EML may contain an organic material and/or an inorganic material. The emissive layer EML may generate any one of red light, green light, and blue light.

The electron control layer ECL may be disposed on the emissive layer EML and the hole control layer HCL. The electron control layer ECL may include an electron transporting layer and an electron injection layer. The hole control layer HCL and the electron control layer ECL may be commonly disposed in the emissive area PA and the non-emissive area NPA.

The second electrode CE may be disposed on the electron control layer ECL. The second electrode CE may be commonly disposed on the pixels PX. The layer having the light emitting element OLED disposed therein may be defined as the display element layer DP-OLED.

The thin film encapsulation layer TFE may be disposed on the second electrode CE and may cover the pixel PX. The thin film encapsulation layer TFE may include a first encapsulation layer EN1 disposed on the second electrode CE, a second encapsulation layer EN2 disposed on the first encapsulation layer EN1, and a third encapsulation layer EN3 disposed on the second encapsulation layer EN2.

The first and third encapsulation layers EN1 and EN3 may include inorganic insulating layers and may protect the pixel PX from moisture/oxygen. The second encapsulation layer EN2 may include an organic insulating layer and may protect the pixel PX from foreign matter such as dust particles.

A first voltage may be applied to the first electrode AE through the transistor TR, and a second voltage having a lower level than the first voltage may be applied to the second electrode CE. Holes and electrons injected into the emissive layer EML may be combined to form excitons, and the light emitting element OLED may emit light as the excitons transition to a ground state.

The input sensing part ISP may be disposed on the thin film encapsulation layer TFE. The input sensing part ISP may be directly manufactured on the upper surface of the thin film encapsulation layer TFE. The input sensing part ISP may include an insulating layer IOL, first and second conductive patterns CTL1 and CTL2, and first and second insulating layers T-IL1 and T-IL2.

The insulating layer IOL may be disposed on the thin film encapsulation layer TFE. The insulating layer IOL may include an inorganic insulating layer. At least one inorganic insulating layer may be provided on the thin film encapsulation layer TFE as the insulating layer IOL.

The first conductive pattern CTL1 may be disposed on the insulating layer IOL. The first insulating layer T-IL1 may be disposed on the insulating layer IOL to cover the first conductive pattern CTL1. The first insulating layer T-IL1 may include an inorganic insulating layer or an organic insulating layer.

The second conductive pattern CTL2 may be disposed over the first conductive pattern CTL1. The second conductive pattern CTL2 may be disposed on the first insulating layer T-IL1. The second insulating layer T-IL2 may be disposed on the first insulating layer T-IL1 to cover the second conductive pattern CTL2. The second insulating layer T-IL2 may include an organic insulating layer.

The first and second conductive patterns CTL1 and CTL2 may overlap the non-emissive area NPA in a plan view. Although not illustrated, the first and second conductive patterns CTL1 and CTL2 may be disposed over the non-emissive area NPA between the emissive areas PA and may have a mesh shape.

The first and second conductive patterns CTL1 and CTL2 may form the above-described sensors of the input sensing part ISP. For example, the first and second conductive patterns CTL1 and CTL2 having a mesh shape may be separated from each other in a predetermined area to form the sensors. A portion of the second conductive pattern CTL2 may be connected to the first conductive pattern CTL1.

Figure 8:
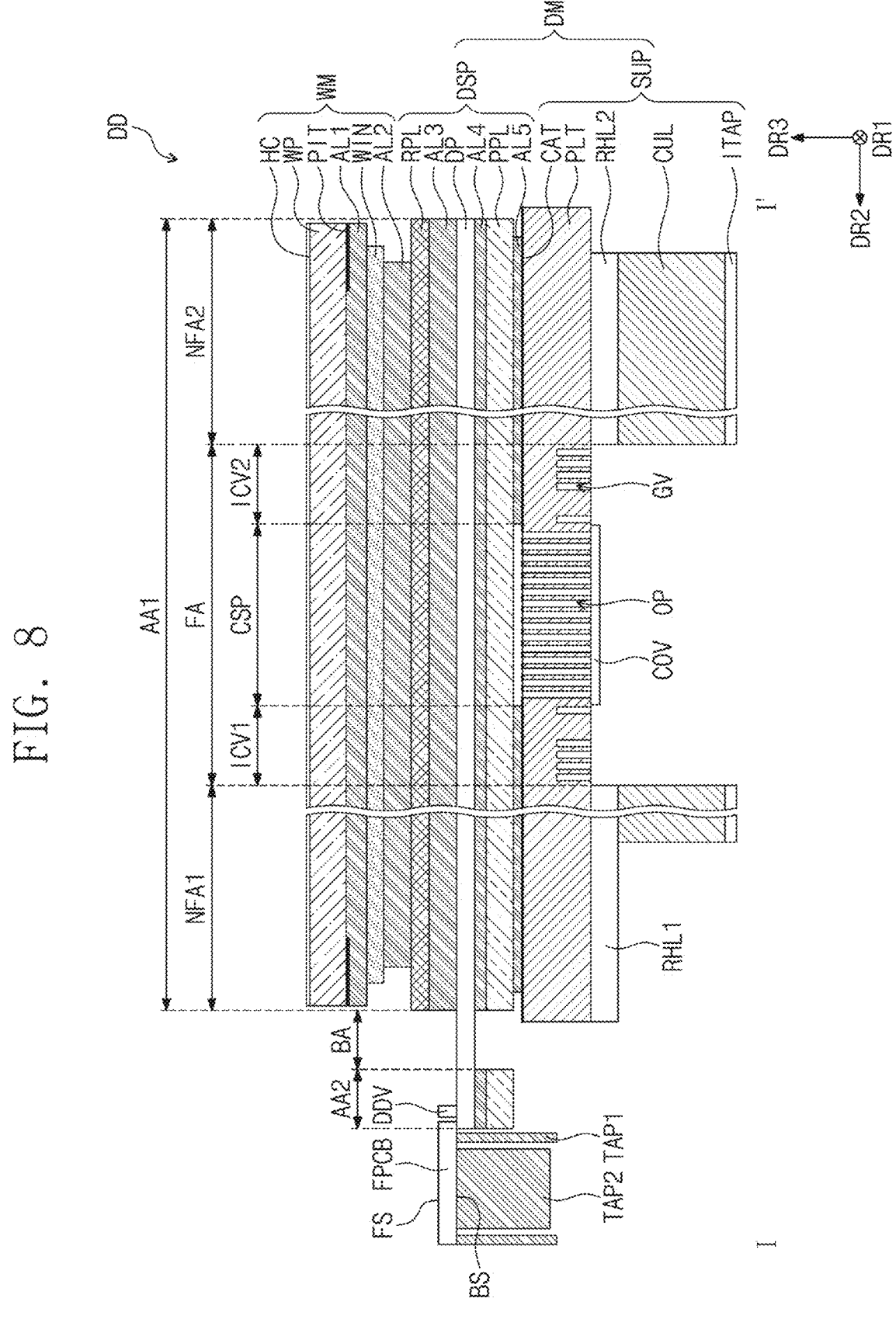
FIG. 8 is a sectional view taken along line I-I' illustrated in FIG. 5.
Figure 9:
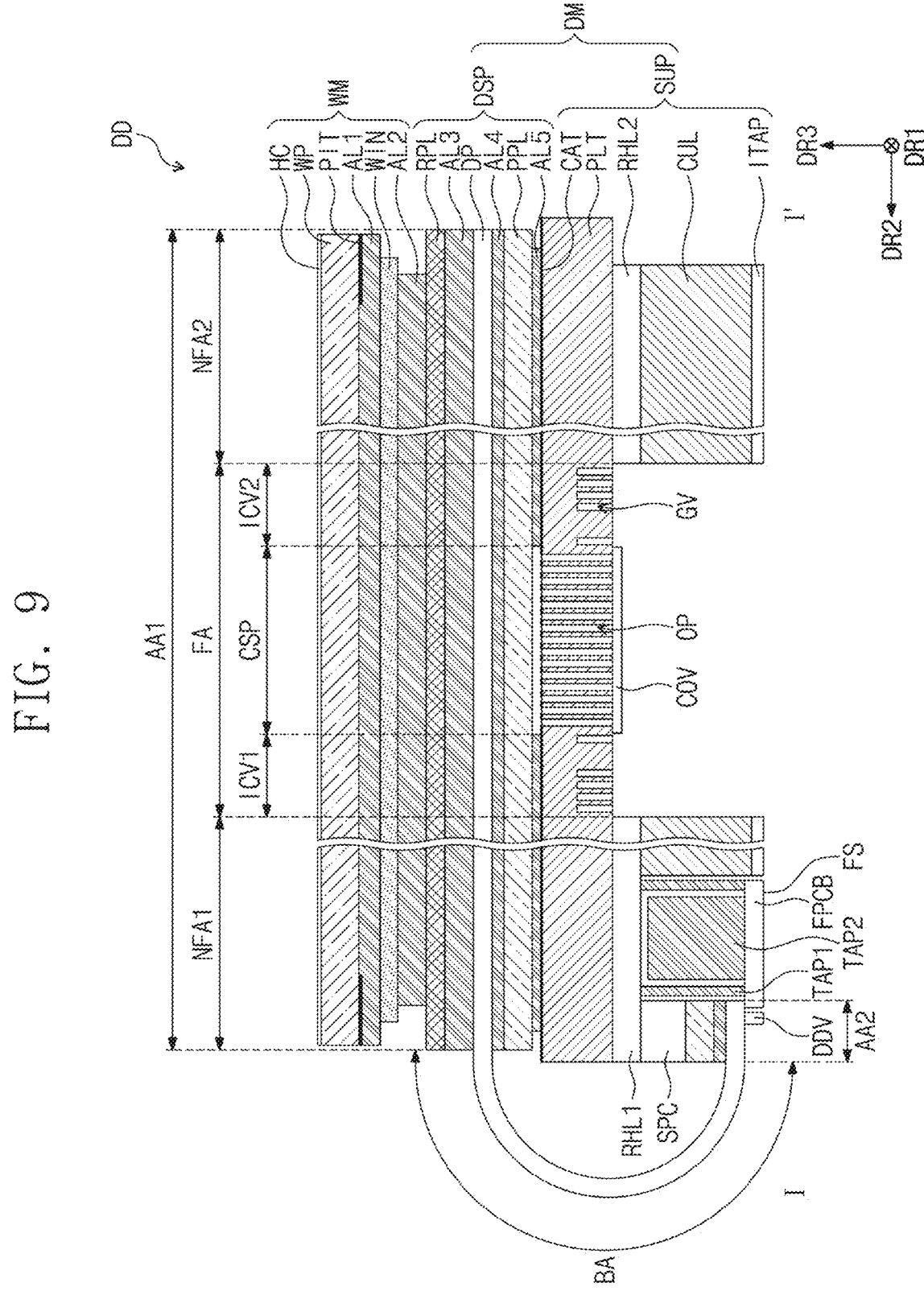
FIG. 9 is a view illustrating a state in which a bending area illustrated in FIG. 8 is bent.

FIG. 8 is a sectional view taken along line I-I' illustrated in FIG. 5. FIG. 9 is a view illustrating a state in which the bending area illustrated in FIG. 8 is bent.

In FIG. 8, the section of the display module DM and the section of the window module WM that correspond to line I-I' are illustrated together.

Referring to FIG. 8, the display device DD may include the display module DM and the window module WM disposed on the display module DM. The display module DM may be a flexible display module.

The display module DM may include the first non-folding area NFA1, the folding area FA, and the second non-folding area NFA2. As the folding area FA is folded about the above-described folding axis FX, the display module DM may be folded.

The display module DM may include a display part DSP and a support part SUP. The support part SUP may be disposed under the display part DSP and may support the display part DSP.

The window module WM may include a window WIN, a window protection layer WP, a hard coating layer HC, and first and second adhesive layers AL1 and AL2. The display part DSP may include the display panel DP, an anti-reflection layer RPL, a panel protection layer PPL, and third to fifth adhesive layers AL3 to AL5.

The anti-reflection layer RPL may be disposed over the display panel DP. The anti-reflection layer RPL may be defined as a film for preventing reflection of external light. The anti-reflection layer RPL may decrease the reflectivity of external light incident toward the display panel DP from the outside.

When external light travelling toward the display panel DP is reflected from the display panel DP and provided back to the user, the user may visually recognize the external light as in a mirror. To prevent such a phenomenon, the anti-reflection layer RPL may include a plurality of color filters that display the same colors as pixels.

External light may be filtered in the same colors as those of the pixels by the color filters. In this case, the external light may not be visible to the user. However, without being limited thereto, the anti-reflection layer RPL may include a phase retarder and/or a polarizer to decrease the reflectivity of external light.

The window WIN may be disposed over the anti-reflection layer RPL. The window WIN may protect the display panel DP and the anti-reflection layer RPL from external scratches. The window WIN may have a property of being optically transparent. The window WIN may include glass. However, without being limited thereto, the window WIN may include a synthetic resin film.

The window protection layer WP may be disposed over the window WIN. The window protection layer WP may contain a flexible plastic material such as polyimide or polyethylene terephthalate.

The hard coating layer HC may be disposed on the upper surface of the window protection layer WP. The upper surface of the window protection layer WP may be coated with the hard coating layer HC.

A printed layer PIT may be disposed on the lower surface of the window protection layer WP. The printed layer PIT may be black in color. However, the color of the printed layer PIT is not limited thereto. The printed layer PIT may be adjacent to the edge of the window protection layer WP in another embodiment.

The panel protection layer PPL may be disposed under the display panel DP. The panel protection layer PPL may protect a lower portion of the display panel DP. The panel protection layer PPL may contain a flexible plastic material. For example, the panel protection layer PPL may contain polyethylene terephthalate ("PET").

The first adhesive layer AL1 may be disposed between the window protection layer WP and the window WIN. The window protection layer WP and the window WIN may be bonded to each other by the first adhesive layer AL1. The first adhesive layer AL1 may cover the printed layer PIT.

The second adhesive layer AL2 may be disposed between the window WIN and the anti-reflection layer RPL. The window WIN and the anti-reflection layer RPL may be bonded to each other by the second adhesive layer AL2.

The third adhesive layer AL3 may be disposed between the anti-reflection layer RPL and the display panel DP. The anti-reflection layer RPL and the display panel DP may be bonded to each other by the third adhesive layer AL3.

The fourth adhesive layer AL4 may be disposed between the display panel DP and the panel protection layer PPL. The display panel DP and the panel protection layer PPL may be bonded to each other by the fourth adhesive layer AL4.

The fifth adhesive layer AL5 may be disposed between the panel protection layer PPL and the support part SUP. The panel protection layer PPL and the support part SUP may be bonded to each other by the fifth adhesive layer AL5. The fifth adhesive layer AL5 may overlap the first and second non-folding areas NFA1 and NFA2 and may not overlap the folding area FA in a plan view. That is, the fifth adhesive layer AL5 may not be disposed in the folding area FA.

The first to fifth adhesive layers AL1 to AL5 may include a transparent adhesive such as a pressure sensitive adhesive ("PSA") or an optically clear adhesive ("OCA"), but are not limited thereto.

Hereinafter, "thickness" may represent a numerical value measured in the third direction DR3, and "width" may represent a numerical value measured in a horizontal direction which is a certain direction on/parallel to the plane defined by the first direction DR1 and the second direction DR2. A thickness direction means the third direction DR3, which is the direction of the plan view.

The panel protection layer PPL may have a smaller thickness than the window protection layer WP, and the anti-reflection layer RPL may have a smaller thickness than the panel protection layer PPL. The thickness of the display panel DP may be smaller than the thickness of the anti-reflection layer RPL and may be equal to the thickness of the window WIN.

For example, the window protection layer WP may have a thickness of 65 micrometers, and the panel protection layer PPL may have a thickness of 50 micrometers. The anti-reflection layer RPL may have a thickness of 31 micrometers, and the window WIN and the display panel DP may have a thickness of 30 micrometers.

The thickness of the first adhesive layer AL1 may be greater than the thickness of the anti-reflection layer RPL and may be smaller than the thickness of the panel protection layer PPL. The thicknesses of the second adhesive layer AL2 and the third adhesive layer AL3 may be equal to the thickness of the panel protection layer PPL. The thickness of the fourth adhesive layer AL4 may be smaller than the thickness of the display panel DP. The thickness of the fifth adhesive layer AL5 may be smaller than the thickness of the fourth adhesive layer AL4. The thickness of the hard coating layer HC may be smaller than the thickness of the fifth adhesive layer AL5.

For example, the first adhesive layer AL1 may have a thickness of 35 micrometers. The second adhesive layer AL2 and the third adhesive layer AL3 may have a thickness of 50 micrometers. The fourth adhesive layer AL4 may have a thickness of 18 micrometers. The fifth adhesive layer AL5 may have a thickness of 16 micrometers. The hard coating layer HC may have a thickness of 5 micrometers.

The display panel DP, the anti-reflection layer RPL, the panel protection layer PPL, and the third and fourth adhesive layers AL3 and AL4 may have the same width. The window protection layer WP and the first adhesive layer AL1 may have the same width.

The widths of the display panel DP, the anti-reflection layer RPL, the panel protection layer PPL, and the third and fourth adhesive layers AL3 and AL4 may be greater than the widths of the window protection layer WP and the first adhesive layer AL1. The width of the display panel DP may indicate the width of the portion of the display panel DP disposed in the first area AA1. The peripheries of the display panel DP, the anti-reflection layer RPL, the panel protection layer PPL, and the third and fourth adhesive layers AL3 and AL4 may be disposed outward of the peripheries of the window protection layer WP and the first adhesive layer AL1.

The widths of the window WIN and the second adhesive layer AL2 may be smaller than the widths of the window protection layer WP and the first adhesive layer AL1. The width of the second adhesive layer AL2 may be smaller than the width of the window WIN. The edge of the window WIN may be disposed inward of the peripheries of the window protection layer WP and the first adhesive layer AL1. The edge of the second adhesive layer AL2 may be disposed inward of the edge of the window WIN.

The width of the fifth adhesive layer AL5 may be smaller than the width of the display panel DP. The edge of the fifth adhesive layer AL5 may be disposed inward of the edge of the display panel DP.

The support part SUP may include a support plate PLT, a coating layer CAT, first and second heat radiating layers RHL1 and RHL2, a cover layer COV, a cushion layer CUL, and an insulating tape ITAP.

The support plate PLT may be disposed under the display part DSP and may support the display part DSP. The support plate PLT may support the display panel DP. The support plate PLT may have a higher rigidity than the display part DSP.

The support plate PLT may be disposed under the panel protection layer PPL. The fifth adhesive layer AL5 may be disposed between the support plate PLT and the panel protection layer PPL. The support plate PLT and the panel protection layer PPL may be bonded to each other by the fifth adhesive layer AL5.

The support plate PLT may contain a metallic material. For example, the support plate PLT may contain stainless steel. However, the metallic material of the support plate PLT is not limited thereto. Furthermore, without being limited thereto, the support plate PLT may contain a non-metallic material. For example, the support plate PLT may contain carbon fiber reinforced plastic ("CFRP") or glass fiber reinforced plastic ("GFRP") as a fiber reinforced composite.

The folding area FA may include a curved portion CSP, a first reverse curvature portion ICV1, and a second reverse curvature portion ICV2. The curved portion CSP may be disposed between the first reverse curvature portion ICV1 and the second reverse curvature portion ICV2. The first reverse curvature portion ICV1 may be disposed between the curved portion CSP and the first non-folding area NFA1. The second reverse curvature portion ICV2 may be disposed between the curved portion CSP and the second non-folding area NFA2.

Figure 13:
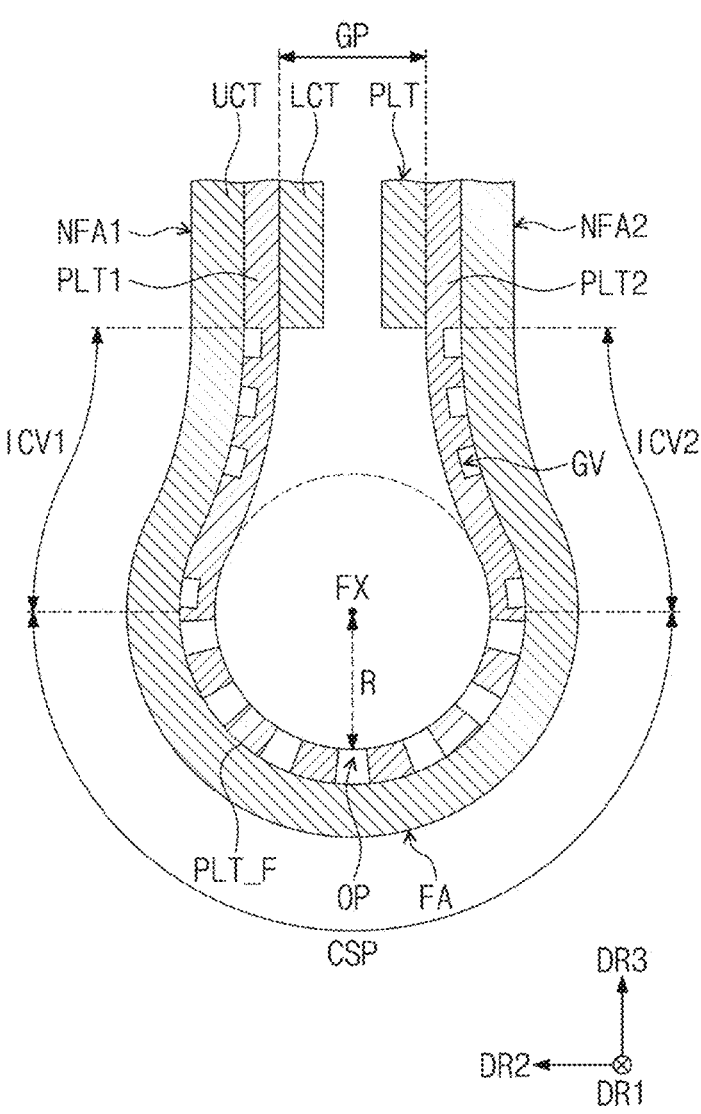
FIG. 13 is a view illustrating a folded state of the support plate illustrated in FIGS. 11 and 12.

When the folding area FA is folded, the curved portion CSP and the first and second reverse curvature portions ICV1 and ICV2 may be bent in opposite directions, and this shape is illustrated in FIG. 13.

A plurality of openings OP may be defined in the portion of the support plate PLT that overlaps the curved portion CSP in a plan view. The openings OP may be formed through portions of the support plate PLT in the third direction DR3.

A plurality of grooves GV may be defined on the lower surfaces of the portions of the support plate PLT that overlap the first and second reverse curvature portions ICV1 and ICV2 in a plan view. The grooves GV may be formed by removing the lower surface of the support plate PLT to a predetermined depth. The lower surface of the support plate PLT may be defined as a surface not facing the first area AA1 of the display panel DP (i.e., a first surface opposite to a second surface facing the first area AA1 of the display panel DP).

As the openings OP and the grooves GV are defined in the portion of the support plate PLT that overlaps the folding area FA, the flexibility of the portion of the support plate PLT that overlaps the folding area FA in a plan view may be increased. As a result, the support plate PLT may be easily folded about the folding area FA.

The coating layer CAT may be disposed on the support plate PLT. The upper surface of the support plate PLT may be coated with the coating layer CAT. The coating layer CAT may be disposed between the support plate PLT and the fifth adhesive layer AL5.

The coating layer CAT may have a black color that absorbs light. In this case, components disposed under the coating layer CAT may not be visible when the display module DM is viewed from above the display module DM.

The cover layer COV may be disposed under the support plate PLT. The cover layer COV may cover the openings OP, which are defined in the support plate PLT, under the support plate PLT. As the cover layer COV covers the openings OP, foreign matter may not infiltrate into the display part DSP through the openings OP.

The cover layer COV may overlap the folding area FA and may not overlap the first and second non-folding areas NFA1 and NFA2 in a plan view. The cover layer COV may overlap the curved portion CSP and may not overlap the first and second reverse curvature portions ICV1 and ICV2.

The cover layer COV may have a lower elastic modulus than the support plate PLT. For example, the cover layer COV may contain thermoplastic poly-urethane or rubber. However, the material of the cover layer COV is not limited thereto. The cover layer COV may be manufactured in a sheet form and may be attached to the support plate PLT in another embodiment.

The first and second heat radiating layers RHL1 and RHL2 may be disposed under the support plate PLT. The first heat radiating layer RHL1 may be disposed under the first non-folding area NFA1 of the display panel DP, and the second heat radiating layer RHL2 may be disposed under the second non-folding area NFA2 of the display panel DP. The first heat radiating layer RHL1 may overlap the first non-folding area NFA1, and the second heat radiating layer RHL2 may overlap the second non-folding area NFA2 in a plan view.

The first heat radiating layer RHL1 and the second heat radiating layer RHL2 may not overlap the folding area FA in a plan view. That is, the first heat radiating layer RHL1 and the second heat radiating layer RHL2 may not be disposed in the folding area FA. The cover layer COV may be disposed between the first heat radiating layer RHL1 and the second heat radiating layer RHL2.

The first heat radiating layer RHL1 and the second heat radiating layer RHL2 may perform a heat radiating function. The first heat radiating layer RHL1 may contain metal to perform a heat radiating function. For example, the first heat radiating layer RHL1 may contain copper. However, the metallic material of the first heat radiating layer RHL1 is not limited thereto. The second heat radiating layer RHL2 may contain graphite to perform a heat radiating function in another embodiment.

Although not illustrated, each of the first heat radiating layer RHL1 and the second heat radiating layer RHL2 may be attached to the lower surface of the support plate PLT by an adhesive layer.

The cushion layer CUL may be disposed under the first heat radiating layer RHL1 and the second heat radiating layer RHL2. The cushion layer CUL may overlap the first and second non-folding areas NFA1 and NFA2 and may not overlap the folding area FA in a plan view. That is, the cushion layer CUL may not be disposed in the folding area FA.

The cushion layer CUL may protect the display panel DP by absorbing external shocks applied to a lower portion of the display module DM. The cushion layer CUL may include a foam sheet having a predetermined elasticity. The cushion layer CUL may include expanded foam, a sponge, poly-urethane, or thermoplastic poly-urethane.

Although not illustrated, the cushion layer CUL may be attached to the lower surfaces of the first heat radiating layer RHL1 and the second heat radiating layer RHL2 by an adhesive layer.

The insulating tape ITAP may be disposed under the cushion layer CUL. The insulating tape ITAP may be attached to the lower surface of the cushion layer CUL. The insulating tape ITAP may include a single-sided tape. For example, an adhesive layer may be disposed on the upper surface of the insulating tape ITAP, and an adhesive layer may not be disposed on the lower surface of the insulating tape ITAP. The upper surface of the insulating tape ITAP may be attached to the cushion layer CUL.

The thickness of the support plate PLT may be smaller than the thickness of the cushion layer CUL, and the thicknesses of the first and second heat radiating layers RHL1 and RHL2 may be equal to the thickness of the panel protection layer PPL. The thickness of the cover layer COV may be equal to the thickness of the fifth adhesive layer AL5, and the thickness of the insulating tape ITAP may be smaller than the thickness of the display panel DP and may be greater than the thickness of the fourth adhesive layer AL4. The thickness of the coating layer CAT may be smaller than the thickness of the hard coating layer HC.

For example, the support plate PLT may have a thickness of 120 micrometers. The cushion layer CUL may have a thickness of 170 micrometers. The first and second heat radiating layers RHL1 and RHL2 may have a thickness of 50 micrometers. The cover layer COV may have a thickness of 16 micrometers. The insulating tape ITAP may have a thickness of 20 micrometers. The coating layer CAT may have a thickness of 0.8 micrometers.

The width of the support plate PLT may be greater than the width of the display part DSP. The edge of the support plate PLT may be disposed outward of the edge of the display part DSP.

In the first non-folding area NFA1, the first heat radiating layer RHL1 may extend to the edge of the support plate PLT. In the first non-folding area NFA1, the widths of the cushion layer CUL and the insulating tape ITAP may be smaller than the width of the first heat radiating layer RHL1. In the first non-folding area NFA1, the peripheries of the cushion layer CUL and the insulating tape ITAP may be disposed inward of the edge of the first heat radiating layer RHL1 that overlaps the edge of the support plate PLT in a plan view.

In the second non-folding area NFA2, the second heat radiating layer RHL2, the cushion layer CUL, and the insulating tape ITAP may have the same width. In the second non-folding area NFA2, the peripheries of the second heat radiating layer RHL2, the cushion layer CUL, and the insulating tape ITAP may be disposed inward of the edge of the support plate PLT.

Referring to FIGS. 8 and 9, the panel protection layer PPL and the fourth adhesive layer AL4 may not be disposed under the bending area BA. The panel protection layer PPL and the fourth adhesive layer AL4 may be disposed under the second area AA2 of the display panel DP. The data driver DDV may be disposed on the second area AA2 of the display panel DP.

The display device DD may include a printed circuit board FPCB, a spacer SPC, a first tape TAP1, and a second tape TAP2. The printed circuit board FPCB may be a flexible circuit board. However, without being limited thereto, the printed circuit board FPCB may be of a rigid type. Although not illustrated, a plurality of elements may be disposed on the front surface FS of the printed circuit board FPCB.

The printed circuit board FPCB may be connected to the second area AA2 of the display panel DP. The printed circuit board FPCB may be connected to one side of the second area AA2. As the bending area BA is bent, the second area AA2 may be disposed under the first area AA1. Accordingly, the data driver DDV and the printed circuit board FPCB may be disposed under the first area AA1.

The first tape TAP1 and the second tape TAP2 may be disposed on the rear surface BS of the printed circuit board FPCB that faces away from the front surface FS of the printed circuit board FPCB. The first tape TAP1 may be disposed adjacent to the edge of the printed circuit board FPCB. The second tape TAP2 may be disposed on the rear surface BS of the printed circuit board FPCB so as to be located inward of the first tape TAP1. Accordingly, the second tape TAP2 may be located farther away from the edge of the printed circuit board FPCB than the first tape TAP1. In this case that the bending area BA is bent and the second area AA2 is disposed under the first area AA1, the rear surface BS of the printed circuit board FPCB faces upward (i.e., the third direction DR3), and the front surface FS of the printed circuit board FPCB faces downward (i.e., direction opposite to the third direction DR3).

The first tape TAP1 may include a double-sided tape. The second tape TAP2 may include a single-sided tape. The first tape TAP1 may be a conductive double-sided tape. The first tape TAP1 and the second tape TAP2 may be attached to the rear surface BS of the printed circuit board FPCB.

In the following description of FIG. 9, the first area AA1, the bending area BA, and the second area AA2 may be areas of the display panel DP.

Referring to FIG. 9, the second area AA2 may be disposed under the first heat radiating layer RHL1 and may be spaced apart from the cushion layer CUL. The second area AA2 may be attached to the first heat radiating layer RHL1.

The first heat radiating layer RHL1 may be disposed between the first area AA1 and the second area AA2. The spacer SPC may be disposed between the first heat radiating layer RHL1 and the second area AA2 and may be spaced apart from the cushion layer CUL. The panel protection layer PPL and the fourth adhesive layer AL4 may be disposed between the spacer SPC and the second area AA2.

The spacer SPC may be disposed adjacent to the bending area BA. The spacer SPC may contain metal. For example, the spacer SPC may contain a metallic material such as stainless steel. However, the metallic material of the spacer SPC is not limited thereto. The spacer SPC may be defined as a step compensation layer in another embodiment.

The spacer SPC may be attached to the first heat radiating layer RHL1 and the second area AA2 by adhesive layers. For example, the adhesive layers may be disposed on the upper surface and the lower surface of the spacer SPC. The upper surface of the spacer SPC may be attached to the first heat radiating layer RHL1, and the lower surface of the spacer SPC may be attached to the panel protection layer PPL over the second area AA2.

When the bending area BA is bent and the second area AA2 is disposed under the first area AA1, the rear surface BS of the printed circuit board FPCB may face the first heat radiating layer RHL1. The printed circuit board FPCB may be adjacent to the cushion layer CUL and the insulating tape ITAP. The printed circuit board FPCB may be attached to the lower surface of the first heat radiating layer RHL1 that does not face the first area AA1. The lower surface is a first surface of the first heat radiating layer RHL1 opposite to a second surface that face the first area AA1.

The first tape TAP1 and the second tape TAP2 may be disposed between the printed circuit board FPCB and the first heat radiating layer RHL1. The first tape TAP1 and the second tape TAP2 may be disposed between the second area AA2 and the cushion layer CUL and between the spacer SPC and the cushion layer CUL.

The first tape TAP1 attached to the rear surface BS of the printed circuit board FPCB may be a double-sided tape and may be attached to the lower surface of the first heat radiating layer RHL1. The printed circuit board FPCB may be attached to the first heat radiating layer RHL1 by the first tape TAP1. The second tape TAP2, which is a single-sided tape, may not be attached to the first heat radiating layer RHL1.

Although not illustrated, the first tape TAP1 may be connected to a ground terminal of the printed circuit board FPCB. Because the first tape TAP1 is a conductive double-sided tape, the ground terminal of the printed circuit board FPCB may be electrically connected to the first heat radiating layer RHL1 through the first tape TAP1. The first heat radiating layer RHL1 containing metal may serve as a ground.

Figure 10:
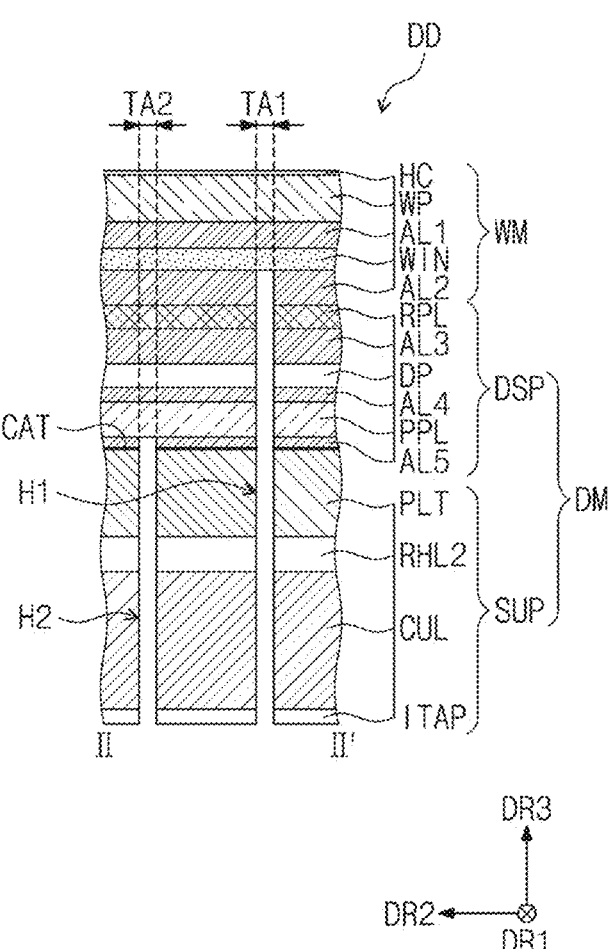
FIG. 10 is a sectional view taken along line II-II' illustrated in FIG. 5.

FIG. 10 is a sectional view taken along line II-II' illustrated in FIG. 5.

Referring to FIG. 10, a first hole H1 and a second hole H2 that overlap the first transmissive area TA1 and the second transmissive area TA2, respectively in a plan view, may be defined in the display device DD. The first hole H1 may be formed from the insulating tape ITAP to the second adhesive layer AL2. For example, the first hole H1 may be formed in the insulating tape ITAP, the cushion layer CUL, the second heat radiating layer RHL2, the panel protection layer PPL, the display panel DP, the anti-reflection layer RPL, and the second to fifth adhesive layers AL2 to AL5.

The second hole H2 may be formed from the insulating tape ITAP to the fifth adhesive layer AL5. For example, the second hole H2 may be formed in the insulating tape ITAP, the cushion layer CUL, the second heat radiating layer RHL2, the coating layer CAT, and the fifth adhesive layer AL5.

The above-described camera CA may be disposed in the first hole H1. The above-described sensor SN may be disposed in the second hole H2. Optical signals may be provided to the camera CA and the sensor SN through the first and second holes H1 and H2. Some components of the display device DD may be partially removed to form the first and second holes H1 and H2, and therefore the light trans-mittances of the first and second transmissive areas TA1 and TA2 may be improved.

Figure 11:
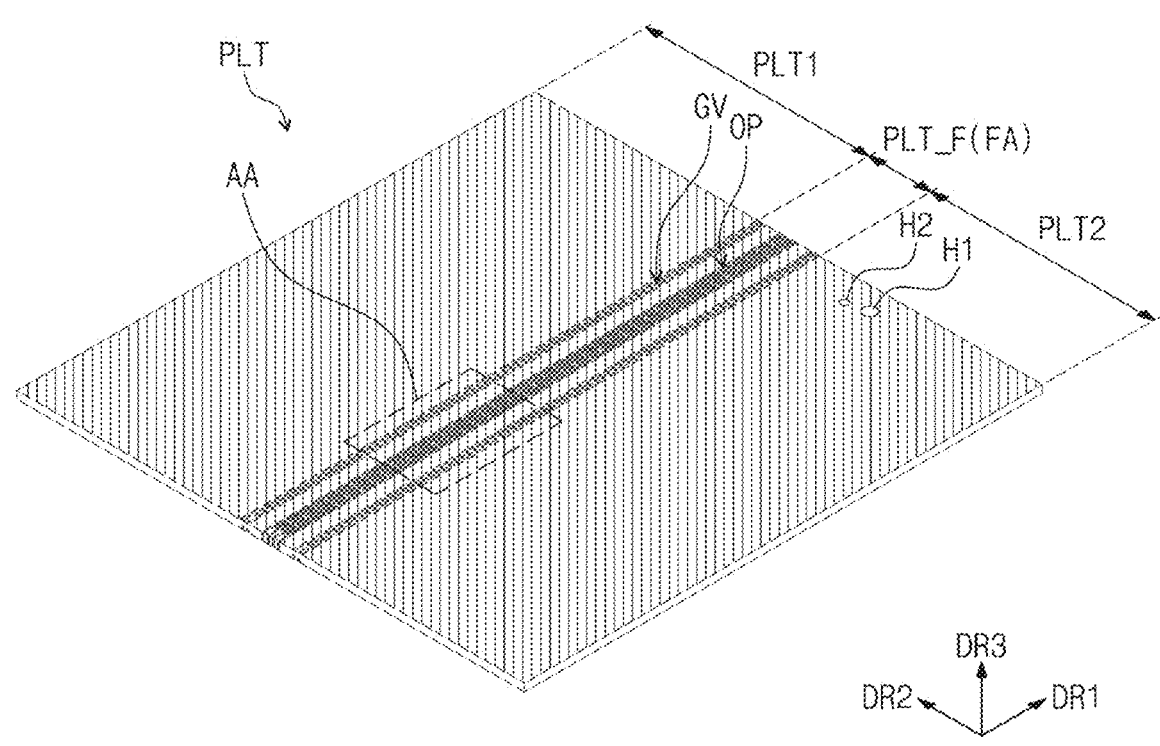
FIG. 11 is a perspective view of a support plate illustrated in FIG. 8.

FIG. 11 is a perspective view of the support plate illus-trated in FIG. 8.

Referring to FIGS. 8 and 11, the support plate PLT may be disposed between the first area AA1 of the display panel DP and the first and second heat radiating layers RHL1 and RHL2. The support plate PLT may include a first support plate PLT1, a folding plate PLT_F, and a second support plate PLT2 arranged in the second direction DR2.

The first support plate PLT1, the folding plate PLT_F, and the second support plate PLT2 may overlap the first non-folding area NFA1, the folding area FA, and the second non-folding area NFA2 in a plan view, respectively. Accord-ingly, the folding plate PLT_F may be disposed between the first support plate PLT1 and the second support plate PLT2.

A grid pattern may be defined in the folding plate PLT_F. For example, the openings OP and the grooves GV described above may be defined in the folding plate PLT_F. In FIG. 11, the grooves GV defined on the lower surface of the folding plate PLT_F are illustrated by dotted lines. The openings OP and the grooves GV may be arranged in a grid form to form the grid pattern in the folding plate PLT_F.

As the openings OP and the grooves GV are defined in the folding plate PLT_F, the area of the folding plate PLT_F may be decreased, and thus the rigidity of the folding plate PLT_F may be lowered. Accordingly, when the openings OP and the grooves GV are defined in the folding plate PLT_F, the flexibility of the folding plate PLT_F may be improved, as compared with when the openings OP and the grooves GV are not defined in the folding plate PLT_F. As a result, the folding plate PLT_F may be more easily folded.

The first hole H1 and the second hole H2 described above may be defined in the second support plate PLT2. The first hole H1 and the second hole H2 may be adjacent to the edge of the second support plate PLT2.

Figure 12:
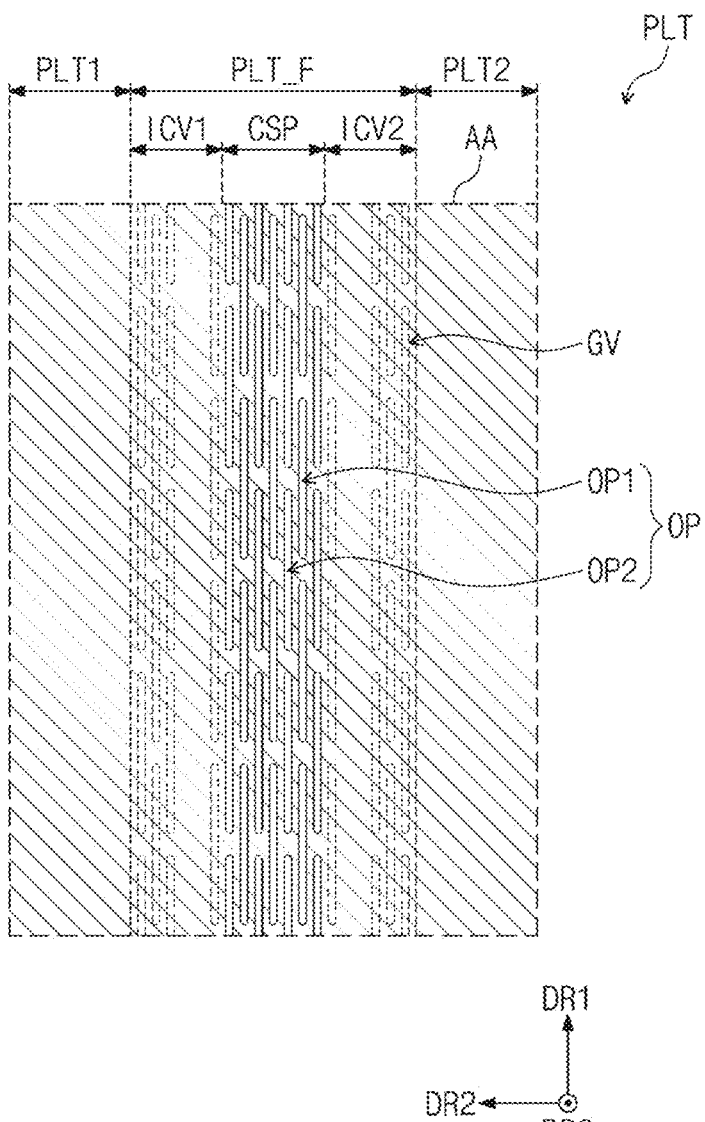
FIG. 12 is an enlarged plan view of area AA illustrated in FIG. 11.

FIG. 12 is an enlarged plan view of area AA illustrated in FIG. 11.

Referring to FIG. 12, the folding plate PLT_F may include a first reverse curvature portion ICV1, a curved portion CSP, and a second reverse curvature portion ICV2 arranged in the second direction DR2. The first reverse curvature portion ICV1, the curved portion CSP, and the second reverse curvature portion ICV2 may correspond to the first reverse curvature portion ICV1, the curved portion CSP, and the second reverse curvature portion ICV2 of the folding area FA illustrated in FIG. 8.

The curved portion CSP may be disposed between the first reverse curvature portion ICV1 and the second reverse curvature portion ICV2. The first reverse curvature portion ICV1 may be disposed between the curved portion CSP and the first support plate PLT1. The second reverse curvature portion ICV2 may be disposed between the curved portion CSP and the second support plate PLT2.

For example, the curved portion CSP may be disposed in the central portion of the folding plate PLT_F. The first reverse curvature portion ICV1 may be defined as a portion of the folding plate PLT_F that is adjacent to the first support plate PLT1. The second reverse curvature portion ICV2 may be defined as a portion of the folding plate PLT_F that is adjacent to the second support plate PLT2.

The openings OP may be defined in the curved portion CSP. The openings OP may be arranged in the first direction DR1 and the second direction DR2. The openings OP may extend longer in the first direction DR1 than in the second direction DR2. The openings OP may extend parallel to the above-described folding axis FX.

The openings OP may include a plurality of first openings OP1 arranged in the first direction DR1 and a plurality of second openings OP2 arranged in the first direction DR1 so as to be adjacent to the first openings OP1 in the second direction DR2. The first openings OP1 may be staggered with respect to the second openings OP2.

The grooves GV may be defined in the first and second reverse curvature portions ICV1 and ICV2. As illustrated in FIG. 8, the grooves GV may be defined on the lower surfaces of the first and second reverse curvature portions ICV1 and ICV2. In FIG. 12, the grooves GV defined on the lower surface of the folding plate PLT_F are illustrated by dotted lines.

The grooves GV may be arranged in the first direction DR1 and the second direction DR2 similarly to the openings OP. The grooves GV may extend longer in the first direction DR1 than in the second direction DR2. Some of the grooves GV may be adjacent to the curved portion CSP, and the other grooves GV may be spaced apart from the curved portion CSP.

FIG. 13 is a view illustrating a folded state of the support plate illustrated in FIGS. 11 and 12.

FIG. 13 illustrates a section of the support plate PLT viewed in the first direction DR1. In FIG. 13, structures disposed over the support plate PLT are illustrated as a single layer, and structures disposed under the support plate PLT are illustrated as a single layer. The structures disposed over the support plate PLT may be defined as an upper structure UCT, and the structures disposed under the support plate PLT may be defined as a lower structure LCT.

The number of openings OP and the number of grooves GV in FIGS. 8, 11, 12, and 13 are exemplarily set and may not be the same as each other.

Referring to FIG. 13, the folding area FA may be folded, and the first non-folding area NFA1 and the second non-folding area NFA2 may face each other accordingly.

The folding plate PLT_F may be folded about the folding axis FX, and the support plate PLT may be folded accord-ingly. When the folding plate PLT_F is folded, the curved portion CSP may be bent to have a predetermined curvature. The curved portion CSP may be bent to have a predeter-mined radius R of curvature.

The first reverse curvature portion ICV1 may be bent in opposition to the curved portion CSP. The second reverse curvature portion ICV2 may be bent in opposition to the curved portion CSP. The second reverse curvature portion ICV2 may have a shape symmetrical to a shape of the first reverse curvature portion ICV1.

When the folding plate PLT_F is folded, the first support plate PLT1 and the second support plate PLT2 may remain flat. When the folding plate PLT_F is folded, the distance GP between the first support plate PLT1 and the second support plate PLT2 in the second direction DR2 may be smaller than the diameter of the circle defined by the radius R of curvature. According to this configuration, the folding plate PLT_F may be folded in a dumbbell shape.

As the openings OP are defined in the curved portion CSP and the grooves GV are defined on the first and second reverse curvature portions ICV1 and ICV2, the folding plate PLT_F may be more easily folded.

Figure 14:
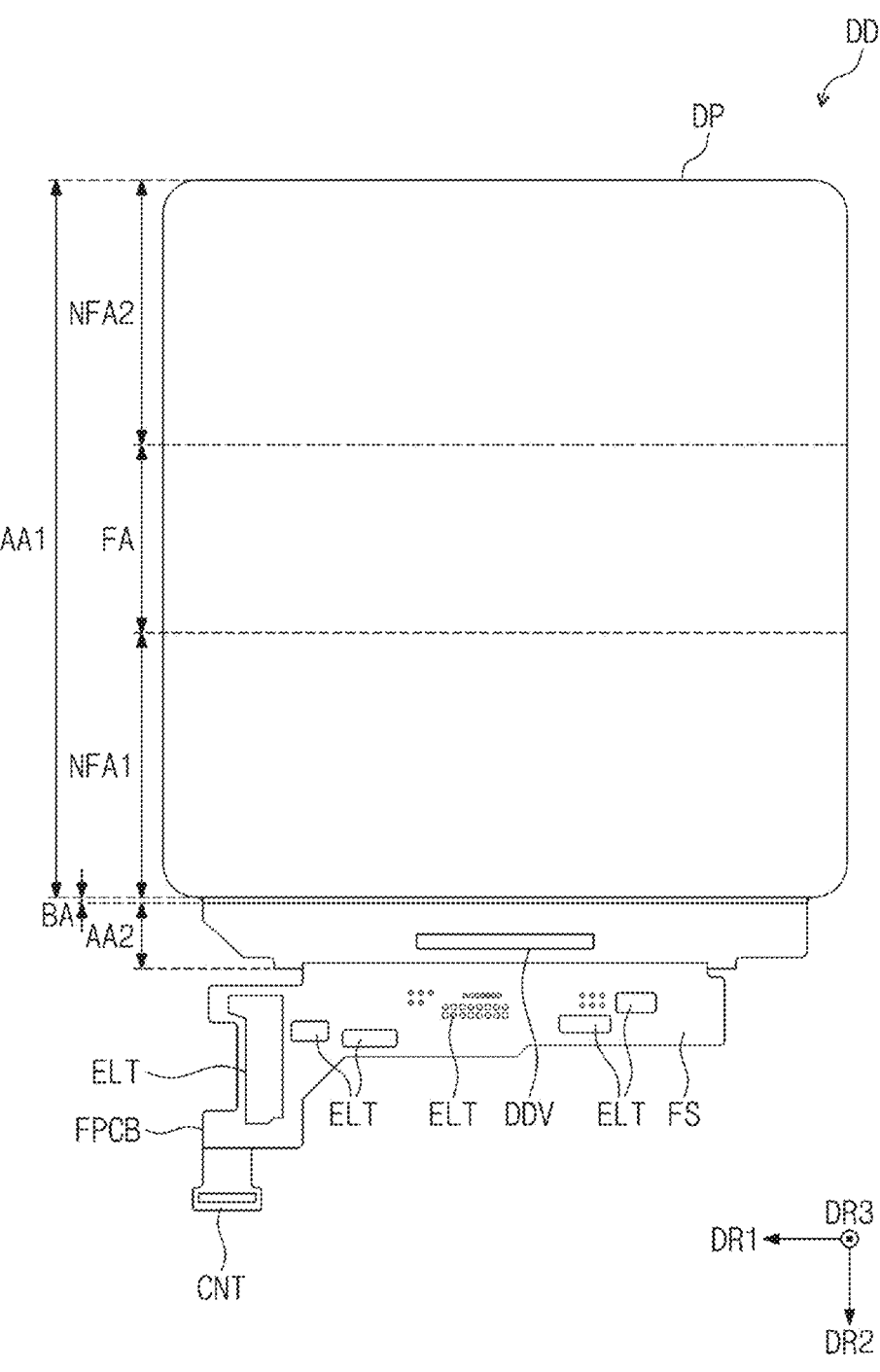
FIG. 14 is a view illustrating a front surface of the display panel and a front surface of a printed circuit board illustrated in FIG. 8.

FIG. 14 is a view illustrating the front surfaces of the display panel and the printed circuit board illustrated in FIG. 8. FIG. 14 is a view illustrating state in which the bending area BA is not bent.

The plan view of the display panel DP illustrated in FIG. 5 is exemplarily illustrated for convenience of description, and the shape of the display panel DP illustrated in FIG. 14 may be substantially similar to the actual structure.

Referring to FIG. 14, one of opposite sides of the second area AA2 that are opposite each other in the first direction DR1 may extend in the second direction DR2, and the other may extend to have an inclined surface with respect to the second direction DR2. The second area AA2 may have a smaller length than the first area AA1 in the first direction DR1. The data driver DDV may be disposed on the second area AA2.

The printed circuit board FPCB may have a predetermined shape and may be connected to one side of the second area AA2. The printed circuit board FPCB may have the shape of "L". However, the shape of the printed circuit board FPCB is not limited thereto. The one side of the second area AA2 to which the printed circuit board FPCB is connected may extend in the first direction DR1 in another embodiment.

A plurality of elements ELT may be disposed on the front surface FS of the printed circuit board FPCB. The elements ELT may include a resistor, a condenser, an inductor, a plurality of terminals, and a plurality of lines as well as the timing controller and the voltage generator described above.

A connector CNT may be connected to one end of the printed circuit board FPCB. The connector CNT may be connected to the control module 10 described above.

Figure 15:
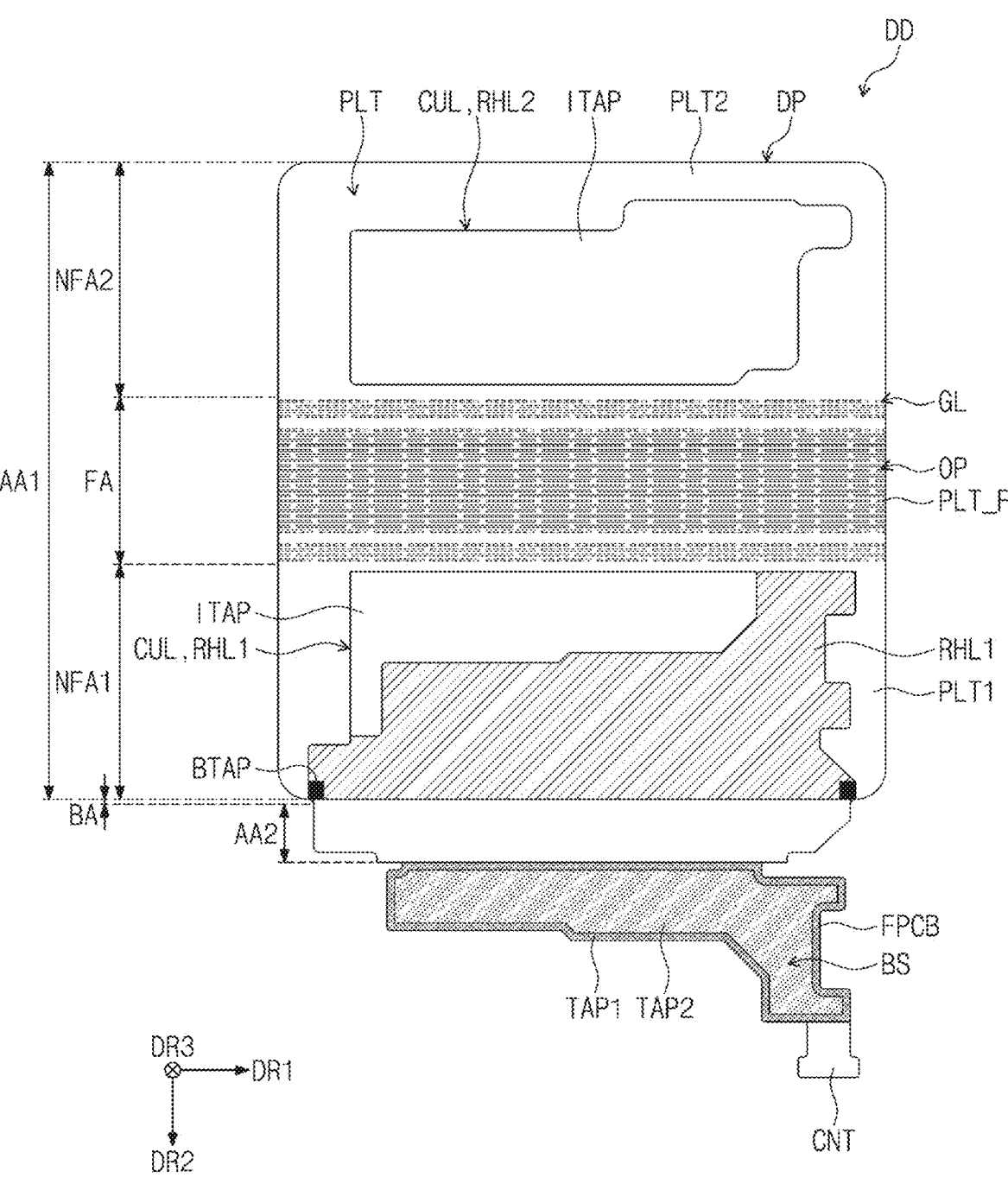
FIG. 15 is a view illustrating a rear surface of the display panel and a rear surface of the printed circuit board illustrated in FIG. 14.
Figure 16:
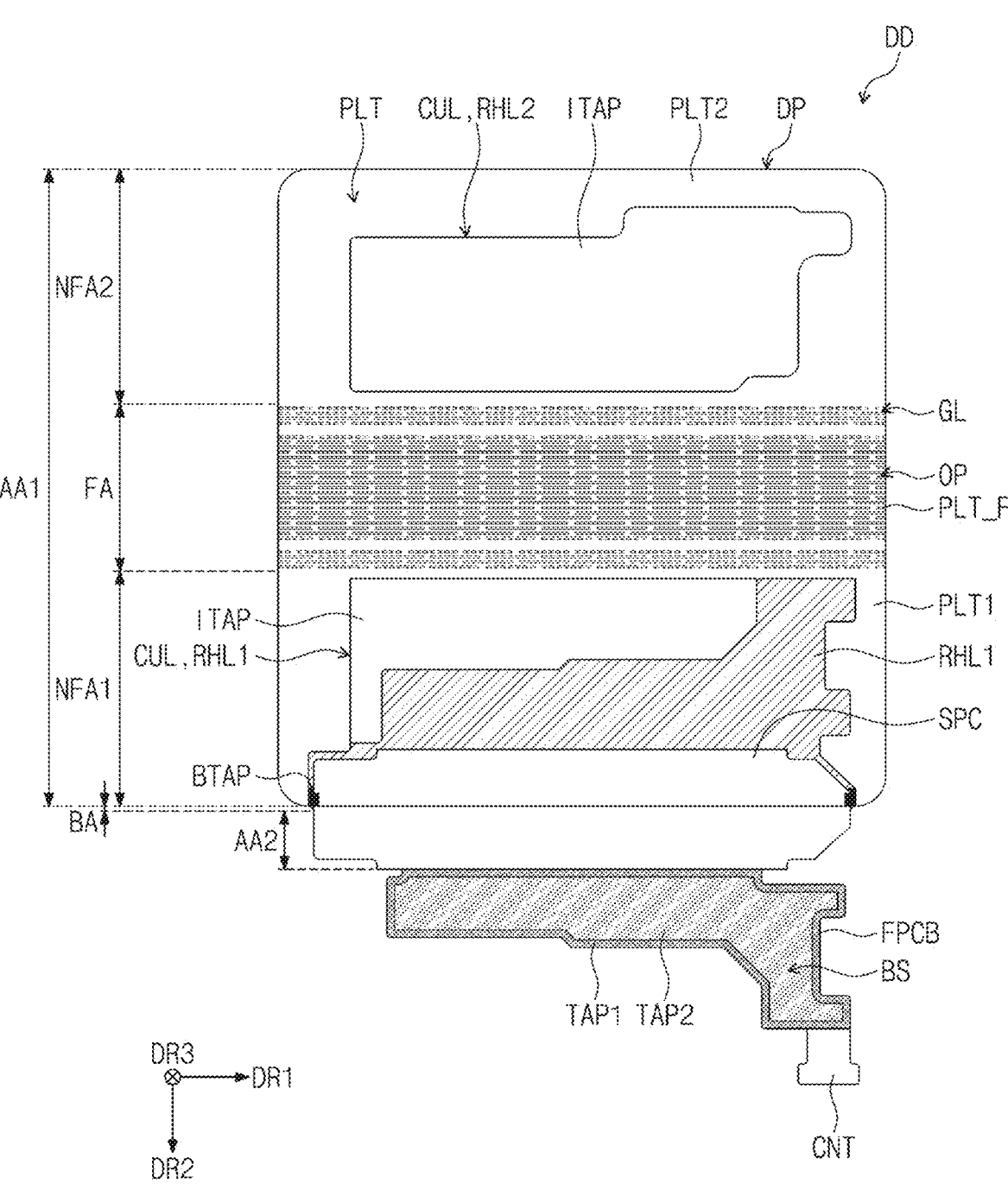
FIG. 16 is a view illustrating a state in which a spacer is disposed in FIG. 15.

FIG. 15 is a view illustrating the rear surfaces of the display panel and the printed circuit board illustrated in FIG. 14. FIG. 16 is a view illustrating a state in which the spacer is disposed in FIG. 15.

In FIG. 15, the planar shapes of the support plate PLT, the first and second heat radiating layers RHL1 and RHL2, the cushion layer CUL, and the insulating tape ITAP, which are disposed under the display panel DP in FIG. 8, are illustrated together.

Referring to FIG. 15, in the first non-folding area NFA1, the cushion layer CUL and the insulating tape ITAP may be disposed on the first heat radiating layer RHL1. In the second non-folding area NFA2, the cushion layer CUL and the insulating tape ITAP may be disposed on the second heat radiating layer RHL2. In the first non-folding area NFA1, the cushion layer CUL and the insulating tape ITAP may be disposed on a portion of the first heat radiating layer RHL1. The openings OP and the grooves GV described above may be defined in the folding plate PLT_F.

The first heat radiating layer RHL1 may be disposed adjacent to the bending area BA. The first heat radiating layer RHL1 may extend parallel to the first direction DR1 and may extend to one side of the first support plate PLT1 that is adjacent to the bending area BA.

The first tape TAP1 and the second tape TAP2 may be disposed on the rear surface BS of the printed circuit board FPCB. The first tape TAP1 may be disposed along the edge of the printed circuit board FPCB so as to be adjacent to the edge of the printed circuit board FPCB. The first tape TAP1 may be disposed along the edge of the printed circuit board FPCB to have a single closed-curve shape in a plan view.

The second tape TAP2 may be disposed in the area defined by the first tape TAP1 on the rear surface BS of the printed circuit board FPCB. For example, the second tape TAP2 may be disposed in the area defined by the first tape TAP1 formed inside the single closed-curve shape. On the rear surface BS of the printed circuit board FPCB, the second tape TAP2 may be disposed inward of the first tape TAP1 and may be located farther away from the edge of the printed circuit board FPCB than the first tape TAP1 in a plan view.

A plurality of light-blocking tapes BTAP may be disposed on the first heat radiating layer RHL1. The light-blocking tapes BTAP may be adjacent to the bending area BA. The light-blocking tapes BTAP may be disposed adjacent to opposite sides of the first heat radiating layer RHL1 that are opposite each other in the first direction DR1. The light-blocking tapes BTAP may be black in color.

Referring to FIG. 16, the spacer SPC may be disposed on the first heat radiating layer RHL1. The spacer SPC may be disposed to cover portions of the light-blocking tapes BTAP. The other portions of the light-blocking tapes BTAP may be exposed by the spacer SPC.

The spacer SPC may have a shape corresponding to the second area AA2. The spacer SPC may have a shape similar to the shape of the second area AA2 such that the second area AA2 is disposed on the spacer SPC. As illustrated in FIG. 16, the spacer SPC may have a shape symmetrical to a shape of the second area AA2 when the bending area BA is not bent.

When viewed on the plane, the portion of the first heat radiating layer RHL1 that does not overlap the spacer SPC and the cushion layer CUL may have a shape corresponding to the printed circuit board FPCB. The portion of the first heat radiating layer RHL1 that does not overlap the spacer SPC and the cushion layer CUL in a plan view may have a shape similar to a shape of the printed circuit board FPCB such that the printed circuit board FPCB is disposed on the first heat radiating layer RHL1.

As illustrated in FIG. 16, when the bending area BA is not bent, the portion of the first heat radiating layer RHL1 that does not overlap the spacer SPC and the cushion layer CUL in a plan view may have a shape symmetrical to a shape of the printed circuit board FPCB.

Figure 17:
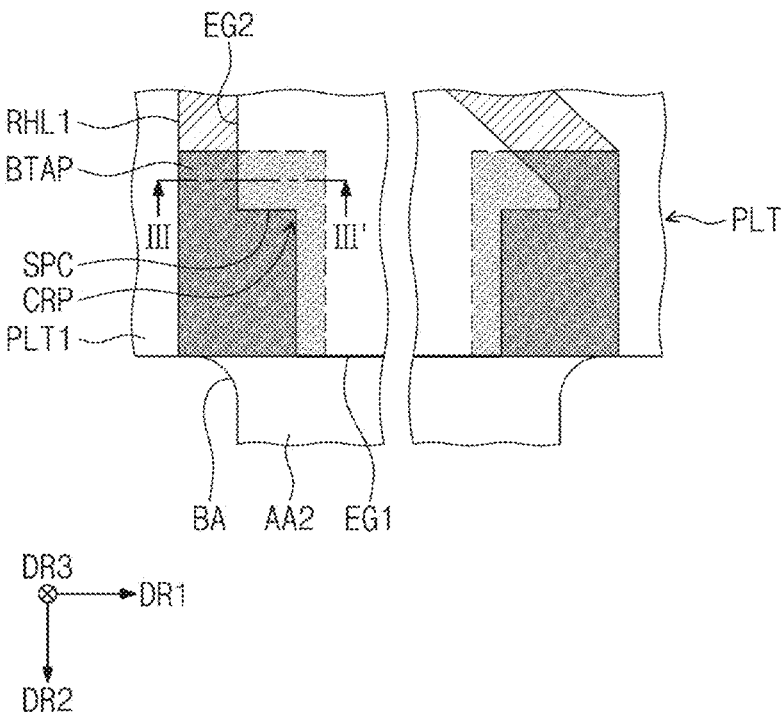
FIG. 17 is an enlarged view of portions where light-blocking tapes are disposed in FIG. 16.
Figure 18:
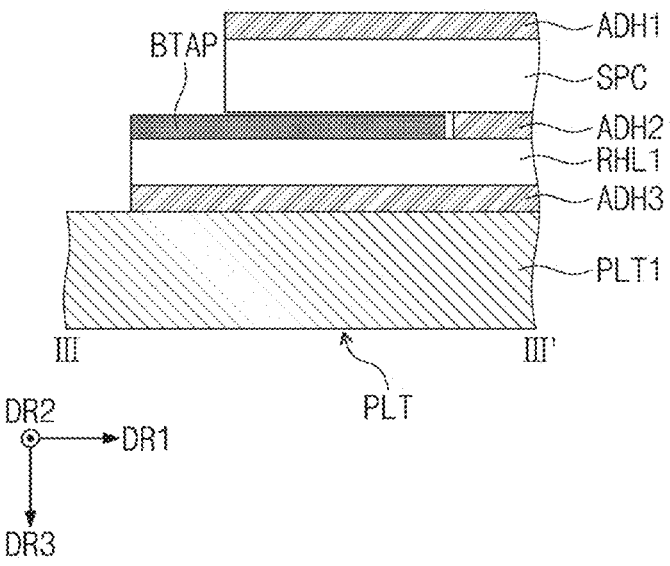
FIG. 18 is a sectional view taken along line III-III' illustrated in FIG. 17.

FIG. 17 is an enlarged view of the portions where the light-blocking tapes are disposed in FIG. 16. FIG. 18 is a sectional view taken along line III-III' illustrated in FIG. 17.

Hereinafter, a configuration of the light-blocking tape BTAP disposed on the left side in FIG. 17 will be described. However, the light-blocking tape BTAP disposed on the right side may have substantially the same configuration as the light-blocking tape BTAP disposed on the left side.

Referring to FIGS. 17 and 18, the light-blocking tape BTAP may be disposed between the first heat radiating layer RHL1 and the spacer SPC. The light-blocking tape BTAP may extend to the outside of the edge of the spacer SPC in a plan view and may be disposed on the first heat radiating layer RHL1. For example, in FIG. 17, a portion of the light-blocking tape BTAP disposed outside the space SPC in a plan view is illustrated in dark gray. Furthermore, a portion of the light-blocking tape BTAP disposed between the first heat radiating layer RHL1 and the spacer SPC is illustrated in light gray.

The spacer SPC may include a first edge EG1 adjacent to the bending area BA (i.e., the first edge EG1 is a border between the spacer SPC and the bending area BA in a plan view) and extending in the first direction DR1, and a second edge EG2 extending in the second direction DR2. The second edge EG2 may be connected to the first edge EG1 through a corner portion CRP of the spacer SPC.

The corner portion CRP may be defined between the first edge EG1 and the second edge EG2 by being recessed toward the inside of the spacer SPC. The corner portion CRP may be formed by being recessed in a right-angled shape. However, the shape of the corner portion CRP is not limited thereto. Substantially, a vertex portion of the spacer SPC may be removed in a right-angled shape to form the corner portion CRP.

When viewed on the plane, the light-blocking tape BTAP may overlap the corner portion CRP, a portion of the light-blocking tape BTAP may be disposed inward of the corner portion CRP, and another portion of the light-blocking tape BTAP may be disposed outward of the corner portion CRP.

A first adhesive layer ADH1 may be disposed on the upper surface of the spacer SPC, and a second adhesive layer ADH2 may be disposed on the lower surface of the spacer SPC. The lower surface of the spacer SPC may face the first heat radiating layer RHL1. The upper surface of the spacer SPC may face away from the lower surface of the spacer SPC and may not face the first heat radiating layer RHL1. The second adhesive layer ADH2 may be disposed between the spacer SPC and the first heat radiating layer RHL1. A third adhesive layer ADH3 may be disposed between the first hear radiating layer RHL1 and the support plate PLT.

The spacer SPC may be attached to the first heat radiating layer RHL1 by the second adhesive layer ADH2. The first heat radiating layer RHL1 may be attached to the support plate PLT by the third adhesive layer ADH3. Although not illustrated, the second area AA2 may be attached to the spacer SPC by the first adhesive layer ADH1 when the bending area BA is bent. The first, second, and third adhesive layers ADH1, ADH2, and ADH3 may be pressure sensitive adhesives.

When viewed on the plane, the second adhesive layer ADH2 between the spacer SPC and the first heat radiating layer RHL1 may be disposed around the light-blocking tape BTAP. The second adhesive layer ADH2 between the spacer SPC and the first heat radiating layer RHL1 may not be disposed in the area where the light-blocking tape BTAP is disposed. Accordingly, the light-blocking tape BTAP may not overlap the second adhesive layer ADH2 in a plan view. The light-blocking tape BTAP may extend to the edge of the first heat radiating layer RHL1.

The light-blocking tape BTAP may include a single-sided adhesive. For example, the light-blocking tape BTAP may be attached to the first heat radiating layer RHL1 and may not be attached to the spacer SPC.

Figure 19:
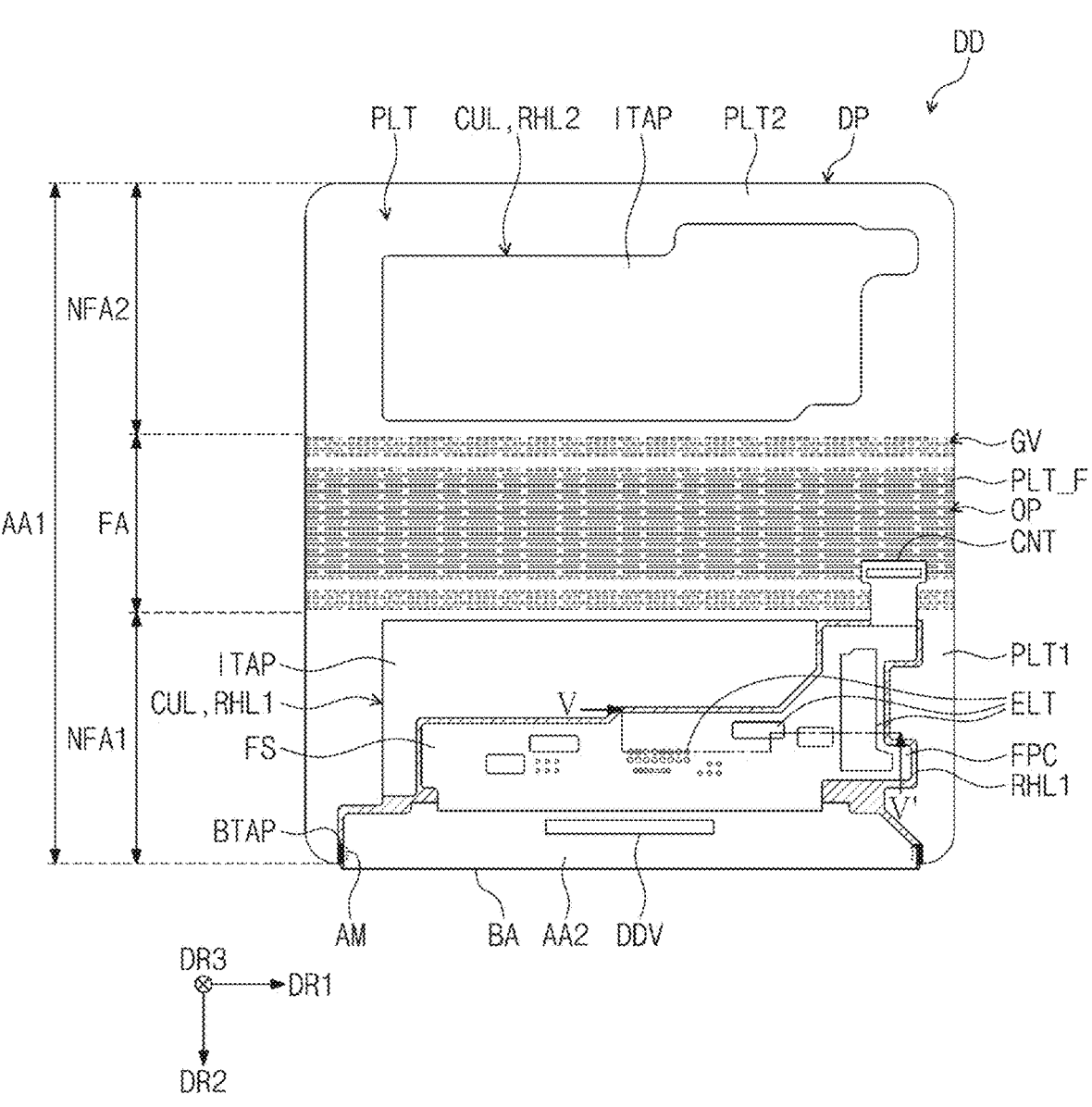
FIG. 19 is a view illustrating a state in which the bending area in FIG. 16 is bent and a second area and the printed circuit board are disposed on a rear surface of a first area.
Figure 20:
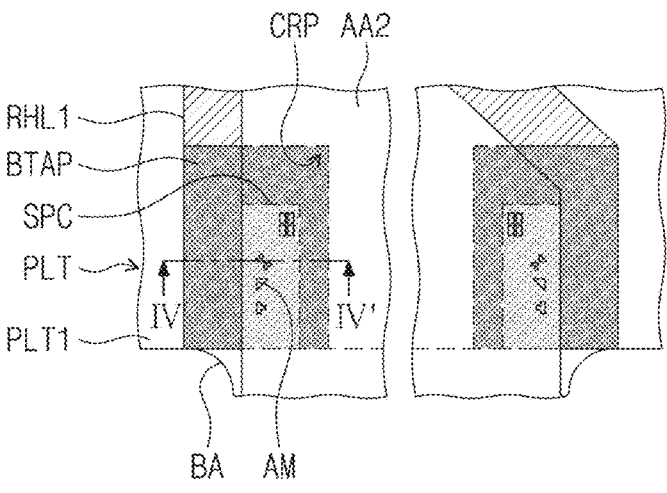
FIG. 20 is an enlarged view of portions where the light-blocking tapes are disposed in FIG. 19.
Figure 20:
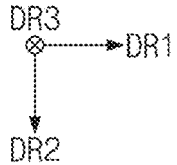
Figure 21:
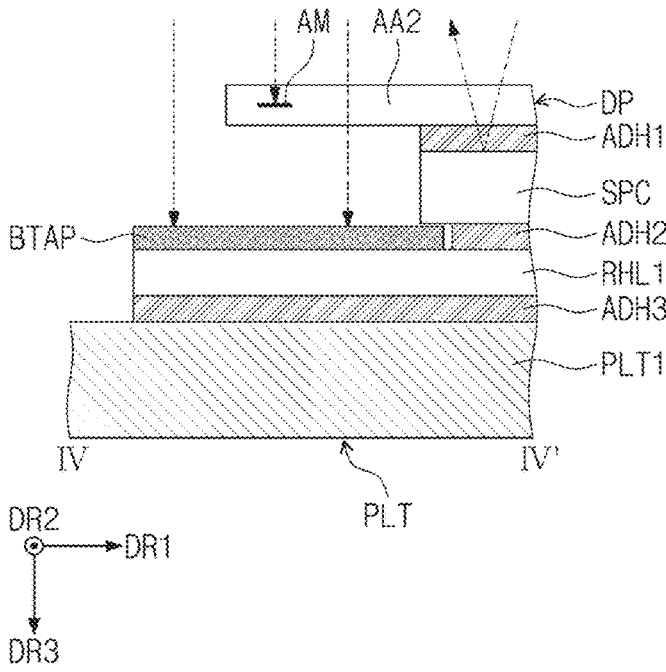
FIG. 21 is a sectional view taken along line IV-IV' illustrated in FIG. 20.

FIG. 19 is a view illustrating a state in which the bending area in FIG. 16 is bent and the second area and the printed circuit board are disposed on the rear surface of the first area. FIG. 20 is an enlarged view of the portions where the light-blocking tapes are disposed in FIG. 19. FIG. 21 is a sectional view taken along line IV-IV' illustrated in FIG. 20.

Hereinafter, FIG. 16 will be described together.

Referring to FIGS. 16 and 19, the bending area BA may be bent, and the printed circuit board FPCB may be attached to the first heat radiating layer RHL1. The rear surface BS of the printed circuit board FPCB may be attached to the first heat radiating layer RHL1. The printed circuit board FPCB may be attached to the first heat radiating layer RHL1 by the above-described first tape TAP1 that is a double-sided tape.

The printed circuit board FPCB may be disposed on a portion of the first heat radiating layer RHL1 on which the cushion layer CUL and the spacer SPC are not disposed. The printed circuit board FPCB may be disposed on the first heat radiating layer RHL1 so as to be spaced apart from the cushion layer CUL and the insulating tape ITAP.

The second area AA2 may be attached to the spacer SPC. The second area AA2 may be attached to the spacer SPC by the above-described first adhesive layer ADH1.

Referring to FIGS. 19 and 20, the second area AA2 may include a plurality of alignment marks AM. The alignment marks AM may be adjacent to the bending area BA. The alignment marks AM may be disposed adjacent to opposite sides of the second area AA2 that are opposite each other in the first direction DR1. The alignment marks AM may have various shapes.

For example, in FIG. 20, a portion of the light-blocking tape BTAP outside the second area AA2 in a plan view is illustrated in dark gray. Furthermore, the portion of the light-blocking tape BTAP disposed between the first heat radiating layer RHL1 and the spacer SPC is illustrated.

The alignment marks AM may be formed in various layers of the display panel DP. For example, the alignment marks AM may be embossed or engraved on a conductive layer of the display panel DP. Without being limited thereto, the alignment marks AM may be embossed or engraved on an insulating layer of the display panel DP.

When viewed on the plane, the alignment marks AM may overlap the light-blocking tape BTAP. When viewed on the plane, the alignment marks AM may be disposed outward of the spacer SPC and may not overlap the spacer SPC. In FIG. 20, the portion of the light-blocking tape BTAP hidden by the second area AA2 is illustrated in light gray.

The alignment marks AM may be disposed in the space defined by the corner portion CRP and may overlap the light-blocking tape BTAP. As the spacer SPC has the corner portion CRP, the alignment marks AM may not overlap the spacer SPC in a plan view.

Referring to FIG. 21, the bending area BA may be bent, and the second area AA2 may be disposed on the spacer SPC accordingly. The second area AA2 may be attached to the spacer SPC by the first adhesive layer ADH1. When the bending area BA is bent, an alignment process may be performed on the second area AA2. The alignment marks AM may be used in the alignment process.

The alignment marks AM may be recognized by a camera (not illustrated). When external light is reflected from the first heat radiating layer RHL1 and provided to the alignment marks AM, a recognition rate of the alignment marks AM may be decreased. However, in an embodiment of the present disclosure, the external light may be absorbed by the light-blocking tape BTAP without being delivered to the first heat radiating layer RHL1 because the light-blocking tape BTAP is disposed on the first heat radiating layer RHL1. Accordingly, the recognition rate of the alignment marks AM may be improved.

If the spacer SPC is disposed to overlap the alignment marks AM in a plan view, external light may be reflected from the spacer SPC and provided to the alignment marks AM, and therefore the recognition rate of the alignment marks AM may be decreased. However, in an embodiment of the present disclosure, a probability that light reflected from the spacer SPC is provided to the alignment marks AM may be decreased because the spacer SPC is disposed so as not to overlap the alignment marks AM in a plan view. Accordingly, the recognition rate of the alignment marks AM may be improved. The light-blocking tape BTAP may be attached to the first heat radiating layer RHL1 and is not attached to the spacer SPC.

Figure 22:
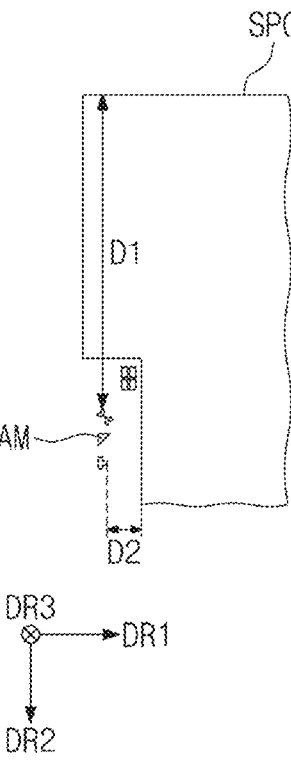
FIG. 22 is a view for explaining an alignment process using alignment marks illustrated in FIG. 20.

FIG. 22 is a view for explaining an alignment process using the alignment marks illustrated in FIG. 20.

In FIG. 22, only a portion of the spacer SPC and the alignment marks AM are illustrated.

Referring to FIG. 22, the alignment marks AM may be recognized by a camera, and an alignment state of the second area AA2 may be controlled by measuring the distance between the alignment marks AM and the edge of the spacer SPC. For example, the alignment state of the second area AA2 may be identified by measuring a first distance D1 between the alignment marks AM and a side surface of the spacer SPC that extends in the first direction DR1 and a second distance D2 between the alignment marks AM and a side surface of the spacer SPC that extends in the second direction DR2. When the first and second distances D1 and D2 deviate from a normal position, the alignment state of the second area AA2 may be adjusted.

Figure 23:
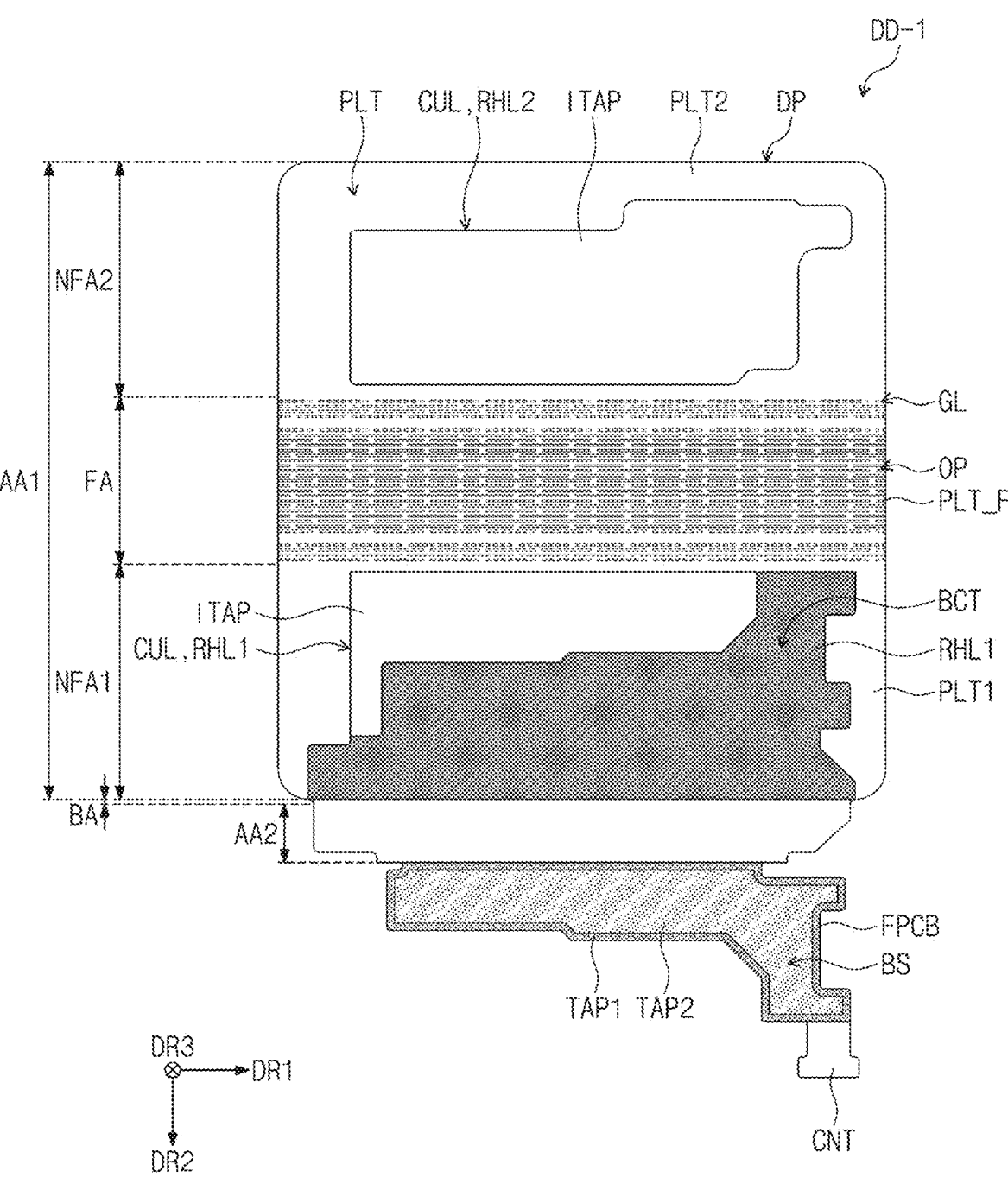
FIG. 23 is a view illustrating a display device according to another embodiment of the present disclosure.
Figure 24:
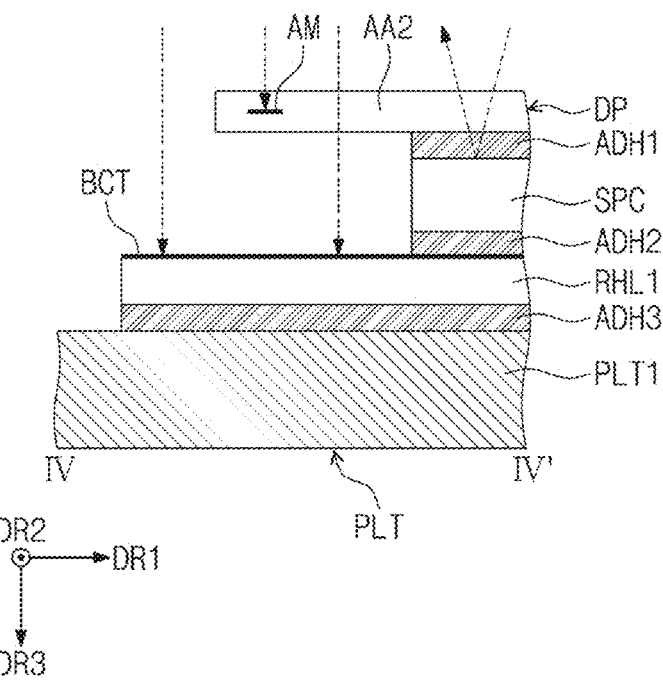
FIG. 24 is a sectional view of a portion of a first heat radiating layer illustrated in FIG. 23.

FIG. 23 is a view illustrating a display device according to another embodiment of the present disclosure. FIG. 24 is a sectional view of a portion of a first heat radiating layer illustrated in FIG. 23.

FIG. 23 is a plan view corresponding to FIG. 15, and FIG. 24 is a sectional view corresponding to FIG. 21. The following description will be focused on the difference between the display device DD illustrated in FIG. 15 and the display device DD-1 illustrated in FIG. 23.

Referring to FIGS. 23 and 24, the display device DD-1 may not include the light-blocking tapes BTAP. The first heat radiating layer RHL1 may be black in color. For example, a light-blocking coating layer BCT may be disposed on one surface of the first heat radiating layer RHL1 that faces a spacer SPC. The light-blocking coating layer BCT may be black in color.

Referring to FIG. 24, when a bending area BA is bent and a second area AA2 is attached to the spacer SPC, alignment marks AM may overlap the light-blocking coating layer BCT in a plan view. The light-blocking coating layer BCT may be used instead of the above-described light-blocking tapes BTAP and may play the same role as the light-blocking tapes BTAP.

In an embodiment of the present disclosure, external light may be absorbed by the light-blocking coating layer BCT without being delivered to the first heat radiating layer RHL1 because the light-blocking coating layer BCT is disposed on the first heat radiating layer RHL1. As the light-blocking coating layer BCT absorbs light, a recognition rate of the alignment marks AM may be improved.

Although the light-blocking coating layer BCT is used instead of the light-blocking tapes BTAP, embodiments of the present disclosure are not limited thereto. For example, the light-blocking tapes BTAP and the light-blocking coating layer BCT may be used together in another embodiment.

Figure 25:
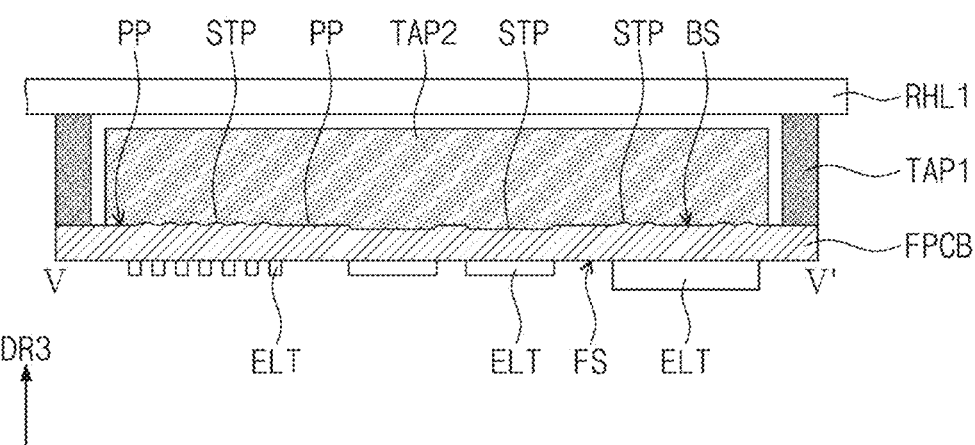
FIG. 25 is a sectional view taken along line V-V' illustrated in FIG. 19.
Figure 26:
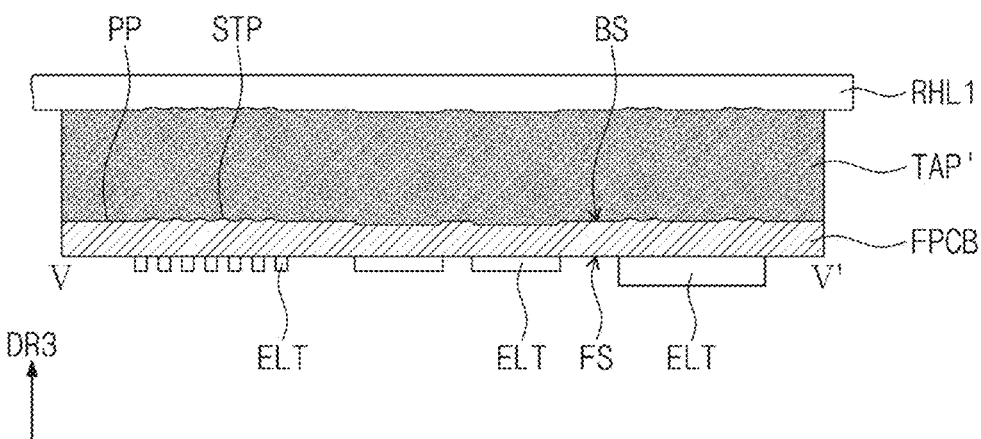
FIG. 26 is a view illustrating the printed circuit board attached to the first heat radiating layer by using a comparative tape according to a comparative example.

FIG. 25 is a sectional view taken along line V-V' illustrated in FIG. 19. FIG. 26 is a view illustrating the printed circuit board attached to the first heat radiating layer by using a comparative tape according to a comparative example.

In FIG. 25, the first heat radiating layer RHL1 is illustrated as being located over the printed circuit board FPCB, and FIG. 26 is a sectional view of a comparative example corresponding to FIG. 25.

Referring to FIG. 25, when the bending area BA is bent, the rear surface BS of the printed circuit board FPCB may face the first heat radiating layer RHL1. The printed circuit board FPCB and the first heat radiating layer RHL1 may be bonded to each other by the first tape TAP1 that is a double-sided tape. The first heat radiating layer RHL1 may be electrically connected to the ground terminal (not illustrated) of the printed circuit board FPCB by the first tape TAP1 having conductivity.

The second tape TAP2, which is a single-sided tape, may be attached to the printed circuit board FPCB and may not be attached to the first heat radiating layer RHL1. The second tape TAP2 may be defined as a step compensation tape that compensates for a step formed between the first tape TAP1 and the first heat radiating layer RHL1.

When the elements ELT are mounted on the front surface FS of the printed circuit board FPCB, raised and recessed portions (i.e., protrusion and depression) may be formed on the rear surface BS of the printed circuit board FPCB according to the mounting of the elements ELT. Hereinafter, the raised and recessed portions on the rear surface BS are defined as step portions STP.

The step portions STP may have different heights from flat portions PP on the rear surface BS. The step portions STP may be located in higher or lower positions than the flat portions PP. For example, a height of the raised portion of the rear surface BS may be higher than that of the flat portions PP, and a height of the recessed portion of the rear surface BS may be lower than that of the flat portions PP. As used herein, the "height" is measured in the third direction DR3. Accordingly, the rear surface BS of the printed circuit board FPCB may have a corrugated shape.

Referring to FIG. 26, the comparative tape TAP' may be disposed between the first heat radiating layer RHL1 and the printed circuit board FPCB, and the first heat radiating layer RHL1 and the printed circuit board FPCB may be bonded to each other by the comparative tape TAP'. The comparative tape TAP' may be a conductive double-sided tape.

When the printed circuit board FPCB is bonded to the first heat radiating layer RHL1 by the comparative tape TAP', the shapes of the step portions STP on the rear surface BS may be transferred to the first heat radiating layer RHL1. For example, the lower surface of the comparative tape TAP' may be deformed in a corrugated shape along the step portions STP on the rear surface BS, and the corrugated shape may be transferred to the upper surface of the comparative tape TAP'. The corrugated shape may be minutely transferred to the surface of the first heat radiating layer RHL1 attached to the upper surface of the comparative tape TAP'. In this case, the raised and recessed portions on the rear surface BS of the printed circuit board FPCB may be visible from the outside.

Referring to FIG. 25, in an embodiment of the present disclosure, the first tape TAP1 may be disposed on the flat portion PP adjacent to the edge of the printed circuit board FPCB, and the printed circuit board FPCB may be attached to the first heat radiating layer RHL1. As the first tape TAP1 is disposed on the flat portion PP, the corrugated shape may not be transferred to the first heat radiating layer RHL1.

The second tape TAP2 may be disposed on the step portions STP and attached to the step portions STP and may not be attached to the first heat radiating layer RHL1. As the second tape TAP2 is not attached to the first heat radiating layer RHL1, the shapes of the step portions STP may not be transferred to the first heat radiating layer RHL1 through the second tape TAP2. Accordingly, the raised and recessed portions on the rear surface BS of the printed circuit board FPCB may not be visible from the outside.

Figure 27:
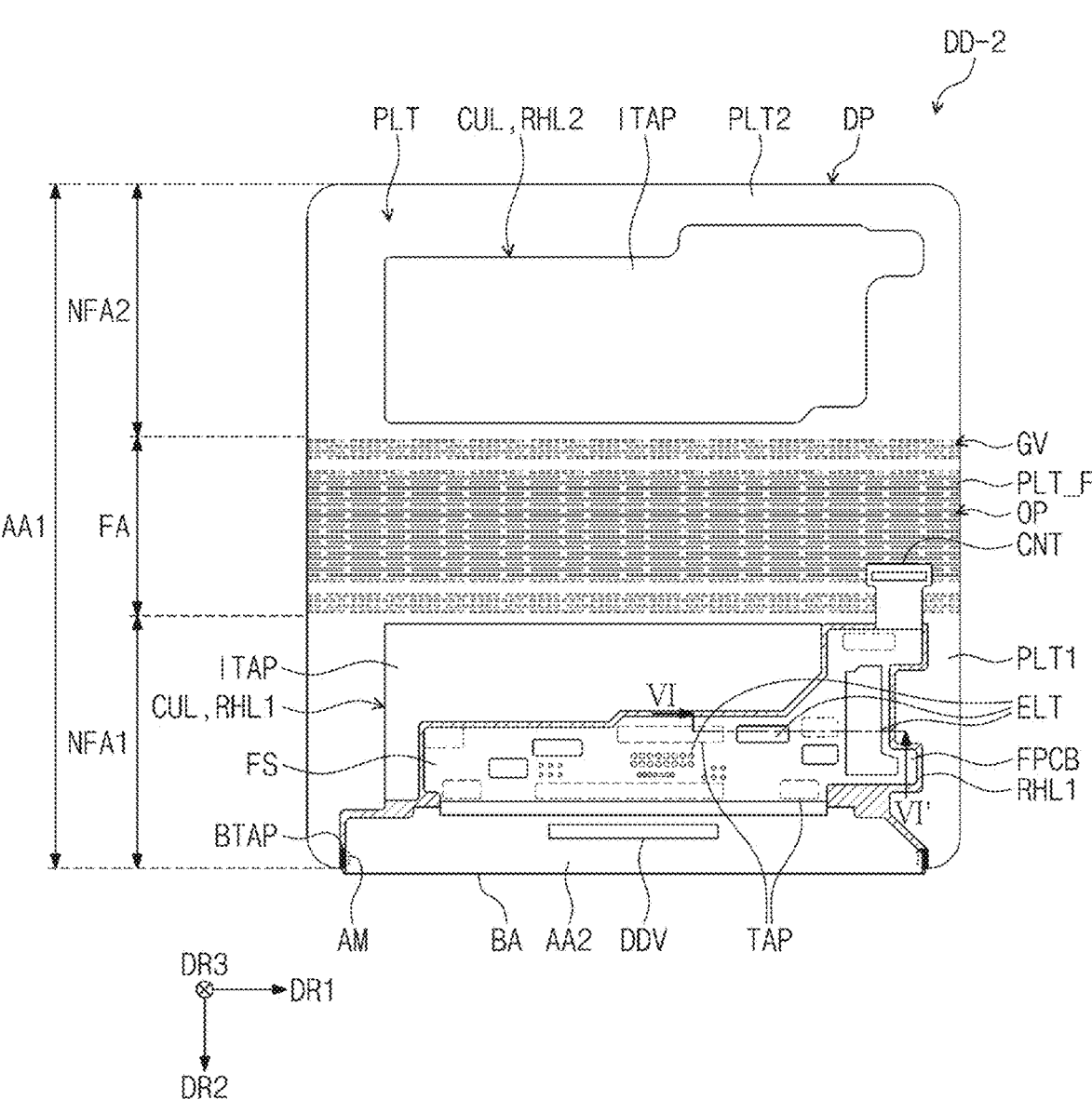
FIG. 27 is a view illustrating a display device according to another embodiment of the present disclosure.
Figure 28:
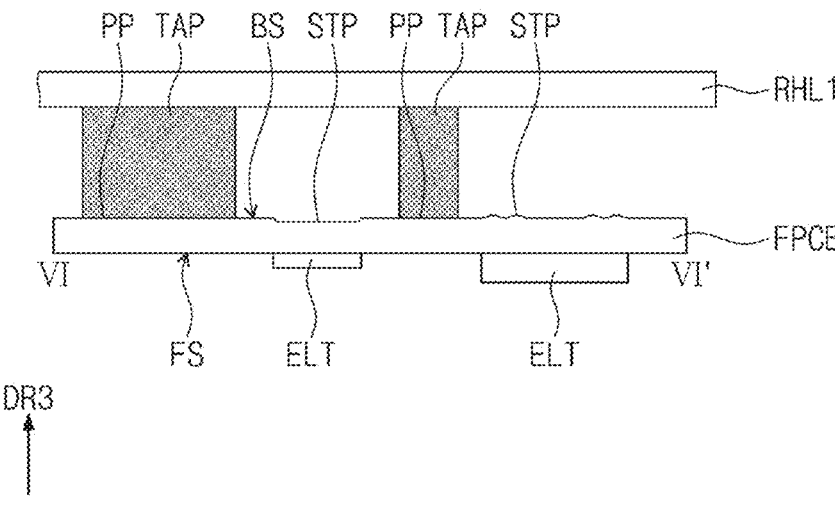
FIG. 28 is a sectional view taken along line VI-VI' illustrated in FIG. 27.

FIG. 27 is a view illustrating a display device according to another embodiment of the present disclosure. FIG. 28 is a sectional view taken along line VI-VI' illustrated in FIG. 27.

FIG. 27 is a plan view corresponding to FIG. 19, and tapes TAP are illustrated by dotted lines in FIG. 27. In FIG. 28, a first heat radiating layer RHL1 is illustrated as being located over a printed circuit board FPCB.

The following description will be focused on the difference between the display device DD illustrated in FIG. 19 and the display device DD-2 illustrated in FIG. 27.

Referring to FIGS. 27 and 28, the plurality of tapes TAP may be disposed between the first heat radiating layer RHL1 and the printed circuit board FPCB. The tapes TAP may be conductive double-sided tapes. The printed circuit board FPCB may be attached to the first heat radiating layer RHL1 by the tapes TAP. The first heat radiating layer RHL1 may be connected to a ground terminal of the printed circuit board FPCB through the tapes TAP.

The tapes TAP may be disposed on flat portions PP and may not be disposed on step portions STP. As the tapes TAP are disposed only on the flat portions PP, the shapes of the step portions STP may not be transferred to the first heat radiating layer RHL1. Accordingly, raised and recessed portions on the rear surface BS of the printed circuit board FPCB may not be visible from the outside.

According to the embodiments of the present disclosure, the alignment mark in the second area disposed under the first area by bending of the bending area may not overlap the spacer and may overlap the light-blocking tape disposed on the heat radiating layer in a plan view. Accordingly, light reflected from the heat radiating layer and light reflected from the spacer may not be provided to the alignment mark, and thus a recognition rate of the alignment mark in a bending process may be improved.

Furthermore, between the printed circuit board and the heat radiating layer, the first tape may be disposed on the edge of the printed circuit board, and the second tape may be disposed in the area defined by the first tape. The printed circuit board and the heat radiating layer may be bonded to each other by the first tape, and the second tape may be attached to the printed circuit board and may not be attached to the heat radiating layer. In this case, the step portions of the printed circuit board may not be transferred to the heat radiating layer by the second tape, and thus the shape of the printed circuit board may not be visible.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device in a folded state, comprising:
a display panel including a first area, a second area including an alignment mark, and a bending area connecting the first and second areas and bent such that the second area is disposed under the first area;
a heat radiating layer disposed between the first area and the second area;
a spacer disposed between the heat radiating layer and the second area; and
a light-blocking tape disposed between the heat radiating layer and the spacer and extending beyond an edge of the spacer in a direction orthogonal to a thickness direction of the display device when viewed on a plane,
wherein the alignment mark overlaps the light-blocking tape in the thickness direction when viewed on the plane,
wherein the spacer is not disposed between the alignment mark and the light-blocking tape, and wherein the spacer and the alignment mark are arranged such that external light reflected by the spacer is not incident on the alignment mark.

2. The display device of claim 1, wherein the light-blocking tape and the alignment mark are adjacent to the bending area.

3. The display device of claim 1, wherein when viewed on the plane, the alignment mark is disposed outside the spacer and does not overlap the spacer.

4. The display device of claim 1, wherein the spacer includes:
a first edge adjacent to the bending area and extending in a first direction;
a second edge extending in a second direction crossing the first direction; and
a corner portion defined between the first and second edges and having a shape recessed toward an inside of the spacer.

5. The display device of claim 4, wherein when viewed on the plane, the light-blocking tape overlaps the corner portion, a portion of the light-blocking tape is disposed inside the corner portion, and another portion of the light-blocking tape is disposed outside the corner portion.

6. The display device of claim 4, wherein the alignment mark is disposed in a space defined by the corner portion and overlaps the light-blocking tape.

7. The display device of claim 1, further comprising:
an adhesive layer disposed between the spacer and the heat radiating layer,
wherein when viewed on the plane, the adhesive layer between the spacer and the heat radiating layer is disposed around the light-blocking tape.

8. The display device of claim 1, wherein the spacer and the heat radiating layer includes metal, and the light-blocking tape has a black color.

9. The display device of claim 1, wherein the light-blocking tape is attached to the heat radiating layer and is not attached to the spacer.

10. The display device of claim 1, further comprising:
a light-blocking coating layer disposed on one surface of the heat radiating layer facing the spacer.

11. The display device of claim 1, further comprising:
a support plate disposed between the first area of the display panel and the heat radiating layer,
wherein the support plate includes a first support plate, a second support plate, and a folding plate between the first and second support plates,
wherein the folding plate includes a first reverse curvature portion, a second reverse curvature portion, and a curved portion between the first and second reverse curvature portions, and
wherein openings are defined in the curved portion, grooves are defined on a lower surface of each of the first and second reverse curvature portions, and the lower surface is a first surface opposite to a second surface that faces the first area.

12. The display device of claim 1, further comprising:
a printed circuit board connected to one side of the second area,
wherein the printed circuit board is attached to a lower surface of the heat radiating layer, and the lower surface is a first surface opposite to a second surface that faces the first area.

13. The display device of claim 12, further comprising:
a first tape disposed between the printed circuit board and the heat radiating layer, wherein the first tape has a single closed-curve shape when viewed on the plane and is disposed along an edge of the printed circuit board.

14. The display device of claim 13, wherein the first tape includes a conductive double-sided tape and is connected to a ground terminal of the printed circuit board.

15. The display device of claim 13, further comprising:

a second tape disposed between the printed circuit board and the heat radiating layer, wherein the second tape is disposed in an area defined by the first tape.

16. The display device of claim 15, wherein the second tape includes a single sided-tape attached to the printed circuit board and not attached to the heat radiating layer.

17. The display device of claim 12, further comprising:

a tape disposed between the heat radiating layer and the printed circuit board, wherein a rear surface of the printed circuit board facing the heat radiating layer includes:

a flat portion; and a step portion disposed around the flat portion to have a different height from the flat portion, and wherein the tape is disposed on the flat portion.

18. A display device in a folded state, comprising:

a display panel including a first area, a second area including an alignment mark, and a bending area connecting the first and second areas and bent such that the second area is disposed under the first area;

a heat radiating layer disposed between the first area and the second area;

a spacer disposed between the heat radiating layer and the second area;

a light-blocking tape disposed between the heat radiating layer and the spacer, extending outside an edge of the spacer and overlapping the alignment mark when viewed on a plane;

a printed circuit board connected to one side of the second area;

a first tape attached to the printed circuit board and the heat radiating layer and adjacent to an edge of the printed circuit board; and a second tape attached to the printed circuit board and not attached to the heat radiating layer, the second tape being located farther away from the edge of the printed circuit board than the first tape.

19. The display device of claim 18, wherein the light-blocking tape and the alignment mark are adjacent to the bending area, and the alignment mark is disposed outside the spacer and does not overlap the spacer when viewed on the plane.

20. An electronic device comprising:

a display device having a first transmissive area defined therein through which an optical signal passes;

an electro-optical module disposed under the display device and which overlaps the first transmissive area and receives the optical signal when viewed on a plane; and a case which accommodates the display device and the electro-optical module, wherein the display device is in a folded state and includes:

a display panel including a first area, a second area including an alignment mark, and a bending area connecting the first and second areas and bent such that the second area is disposed under the first area;

a heat radiating layer disposed between the first area and the second area;

a spacer disposed between the heat radiating layer and the second area; and a light-blocking tape disposed between the heat radiating layer and the spacer and extending beyond an edge of the spacer in a direction orthogonal to a thickness direction of the display device when viewed on the plane, and wherein the alignment mark overlaps the light-blocking tape when viewed in the thickness direction on the plane, wherein the spacer is not disposed between the alignment mark and the light-blocking tape, and wherein the spacer and the alignment mark are arranged such that external light reflected by the spacer is not incident on the alignment mark.

* * * * *